United States Patent
O'Neill et al.

(10) Patent No.: US 11,998,947 B2
(45) Date of Patent: Jun. 4, 2024

(54) MAGNETIZABLE PARTICLES FORMING LIGHT CONTROLLING STRUCTURES AND METHODS OF MAKING SUCH STRUCTURES

(71) Applicant: 3M INNOVATIVE PROPERTIES COMPANY, St. Paul, MN (US)

(72) Inventors: Mark B. O'Neill, Stillwater, MN (US); Gary E. Gaides, Woodbury, MN (US); Tri D. Pham, Woodbury, MN (US); Aaron K. Nienaber, Lake Elmo, MN (US); Ronald D. Jesme, Plymouth, MN (US); Joseph B. Eckel, Vadnais Heights, MN (US); Shawn C. Dodds, St. Paul, MN (US); Bert T. Chien, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 694 days.

(21) Appl. No.: 17/250,318

(22) PCT Filed: Jul. 18, 2019

(86) PCT No.: PCT/US2019/042372
§ 371 (c)(1),
(2) Date: Jan. 4, 2021

(87) PCT Pub. No.: WO2020/018771
PCT Pub. Date: Jan. 23, 2020

(65) Prior Publication Data
US 2021/0294002 A1 Sep. 23, 2021

Related U.S. Application Data

(60) Provisional application No. 62/699,966, filed on Jul. 18, 2018.

(51) Int. Cl.
*B05D 3/00* (2006.01)
*B05D 3/06* (2006.01)
(Continued)

(52) U.S. Cl.
CPC ............. *B05D 3/203* (2013.01); *B05D 5/061* (2013.01); *G02B 5/003* (2013.01); *H01L 31/054* (2014.12);
(Continued)

(58) Field of Classification Search
None
See application file for complete search history.

(56) References Cited

U.S. PATENT DOCUMENTS

| 2,370,636 A | 3/1945 | Carlton |
| 2,857,879 A | 10/1958 | Johnson |

(Continued)

FOREIGN PATENT DOCUMENTS

| GB | 1477767 | 6/1977 |
| JP | 2005-257782 | 9/2005 |

(Continued)

OTHER PUBLICATIONS

International Search Report for PCT International Application No. PCT/US2019/042372, dated Oct. 30, 2019, 5 pages.

*Primary Examiner* — Derek S. Chapel
(74) *Attorney, Agent, or Firm* — Jonathan L. Tolstedt

(57) ABSTRACT

A method of making an optical film for control of light includes positioning a first mixture on a substrate, wherein the first mixture includes a first plurality of magnetizable particles dispersed in a first resin, assembling the first plurality of magnetizable particles into a desired structure for the control of the light by rotating modulation of at least a first magnetic field relative to the first plurality of magnetizable particles, and vitrifying the first resin while the first (Continued)

plurality of magnetizable particles are in the desired structure.

17 Claims, 24 Drawing Sheets

(51) Int. Cl.
| | | |
|---|---|---|
| *B05D 5/06* | | (2006.01) |
| *G02B 5/00* | | (2006.01) |
| *H01L 31/054* | | (2014.01) |
| *H01L 31/048* | | (2014.01) |
| *H02S 20/25* | | (2014.01) |

(52) U.S. Cl.
CPC .......... *H01L 31/0549* (2014.12); *B05D 3/067* (2013.01); *B05D 3/20* (2013.01); *B05D 5/06* (2013.01); *G02B 2207/123* (2013.01); *H01L 31/0488* (2013.01); *H02S 20/25* (2014.12)

(56) References Cited

U.S. PATENT DOCUMENTS

| | | | |
|---|---|---|---|
| 3,625,666 A | 12/1971 | James | |
| 4,008,055 A | 2/1977 | Phaal | |
| 4,612,242 A | 9/1986 | Vesley | |
| 5,104,210 A | 4/1992 | Tokas | |
| 5,181,939 A | 1/1993 | Neff | |
| 5,943,156 A | 8/1999 | Komuro | |
| 7,727,931 B2 | 6/2010 | Brey | |
| 11,724,363 B2 * | 8/2023 | Nienaber | B24D 3/28 |
| | | | 51/298 |
| 2004/0052976 A1 * | 3/2004 | Buczek | C09D 5/36 |
| | | | 427/598 |
| 2005/0106367 A1 * | 5/2005 | Raksha | B05D 3/207 |
| | | | 428/199 |
| 2008/0289262 A1 | 11/2008 | Gao | |
| 2011/0075258 A1 | 3/2011 | Mullen | |
| 2016/0075166 A1 * | 3/2016 | Ritter | D21H 21/48 |
| | | | 156/60 |
| 2017/0003424 A1 | 1/2017 | Rahman et al. | |
| 2021/0273126 A1 * | 9/2021 | O'Neill | H01L 31/0549 |

FOREIGN PATENT DOCUMENTS

| | | |
|---|---|---|
| JP | 2008176065 A | 7/2008 |
| WO | WO 2018-080703 | 5/2018 |
| WO | WO 2018-080704 | 5/2018 |
| WO | WO 2018-080705 | 5/2018 |
| WO | WO 2018-080755 | 5/2018 |
| WO | WO 2018-080756 | 5/2018 |
| WO | WO 2018-080765 | 5/2018 |
| WO | WO 2018-080784 | 5/2018 |
| WO | WO 2018-080799 | 5/2018 |
| WO | WO 2018-134732 | 7/2018 |
| WO | WO 2018-136268 | 7/2018 |
| WO | WO 2018-136269 | 7/2018 |
| WO | WO 2018-136271 | 7/2018 |

\* cited by examiner

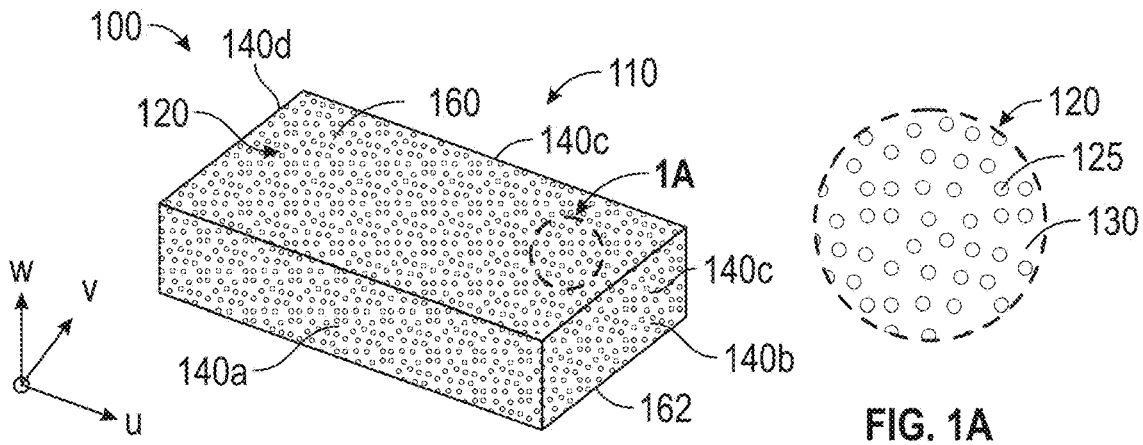
FIG. 1
FIG. 1A
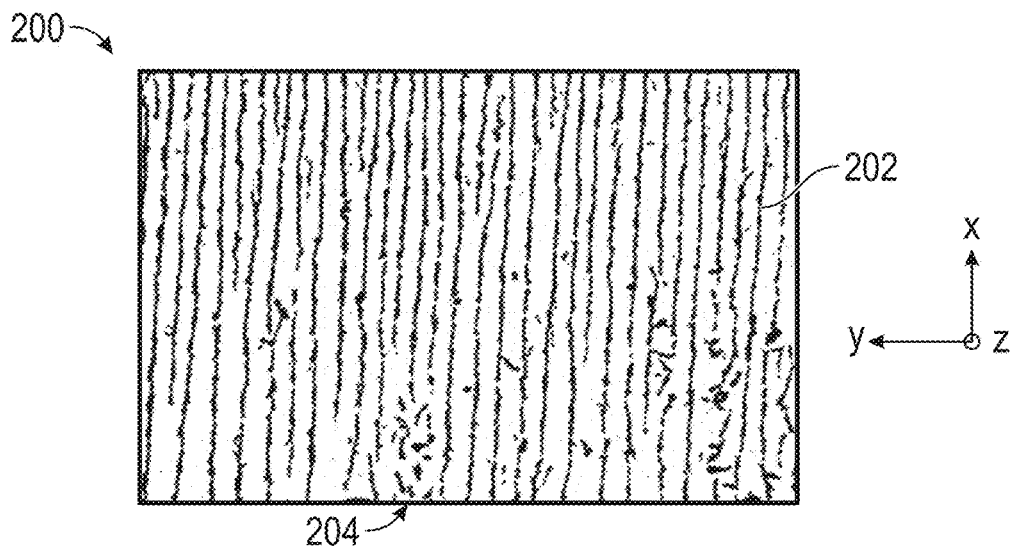
FIG. 2
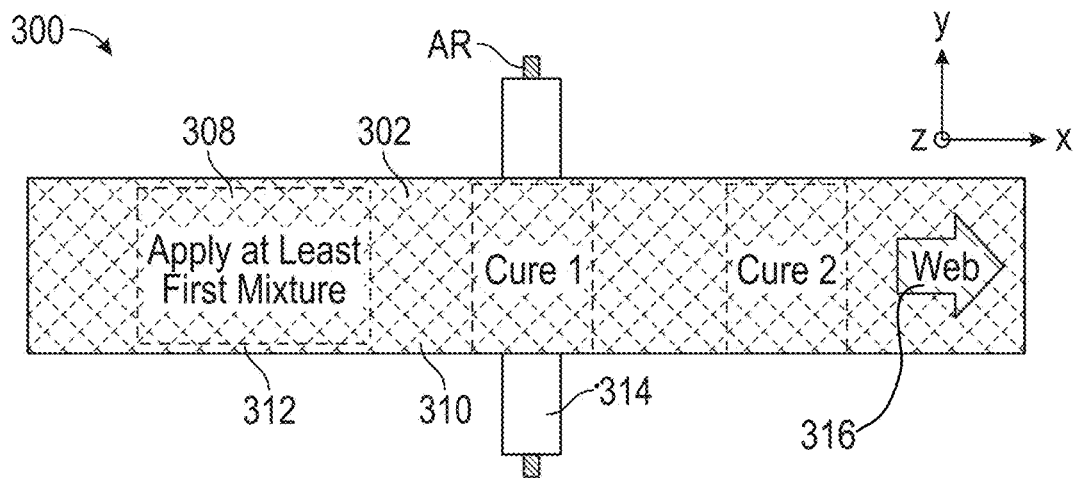
FIG. 3

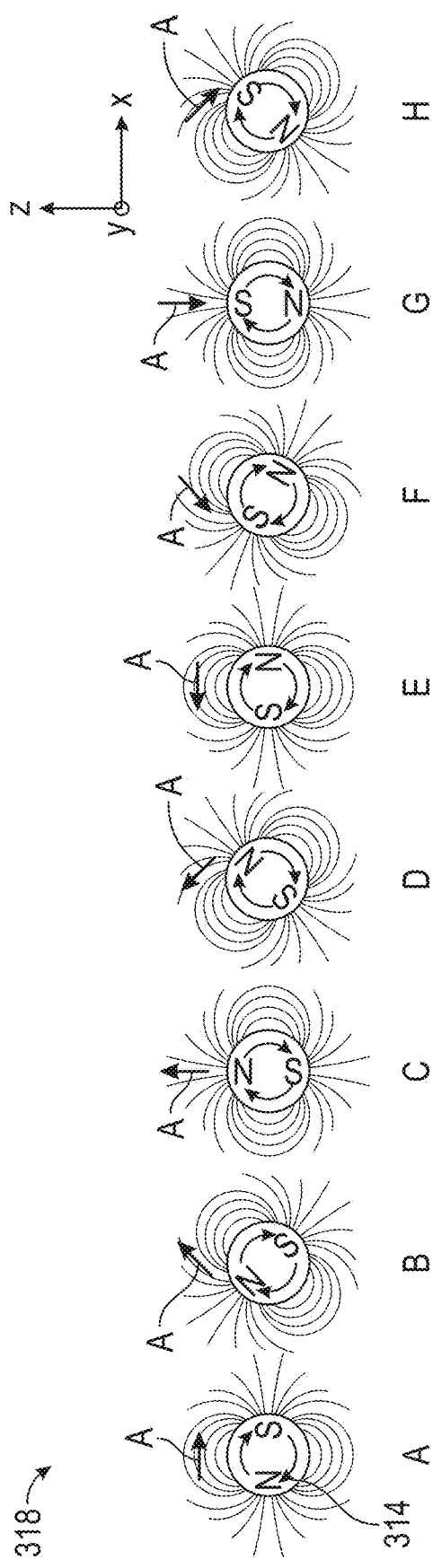
FIG. 4A
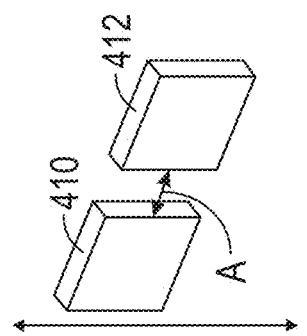
FIG. 5C
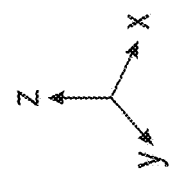
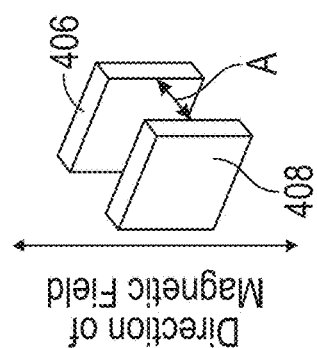
FIG. 5B
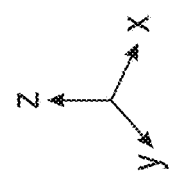
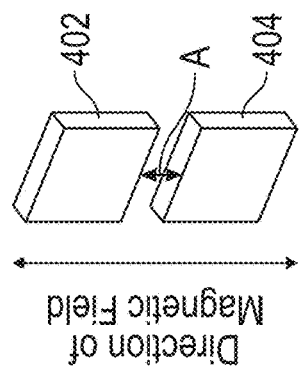
FIG. 5A
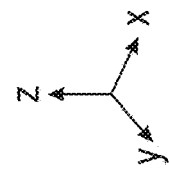

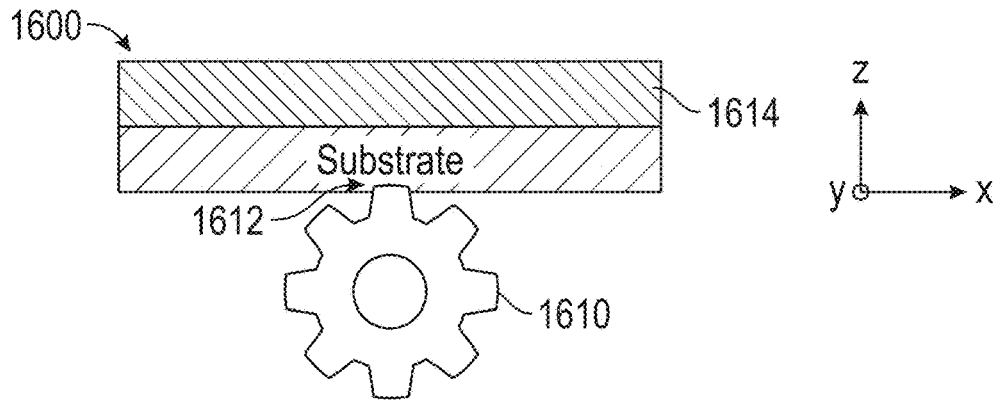
FIG. 19
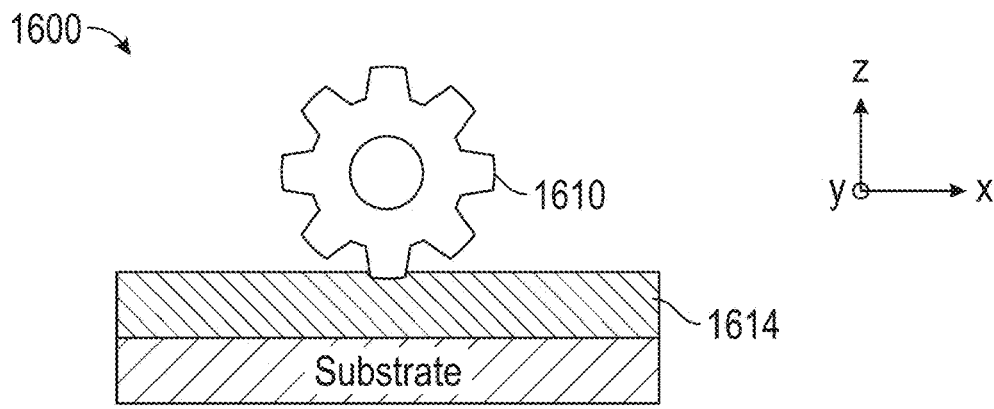
FIG. 20
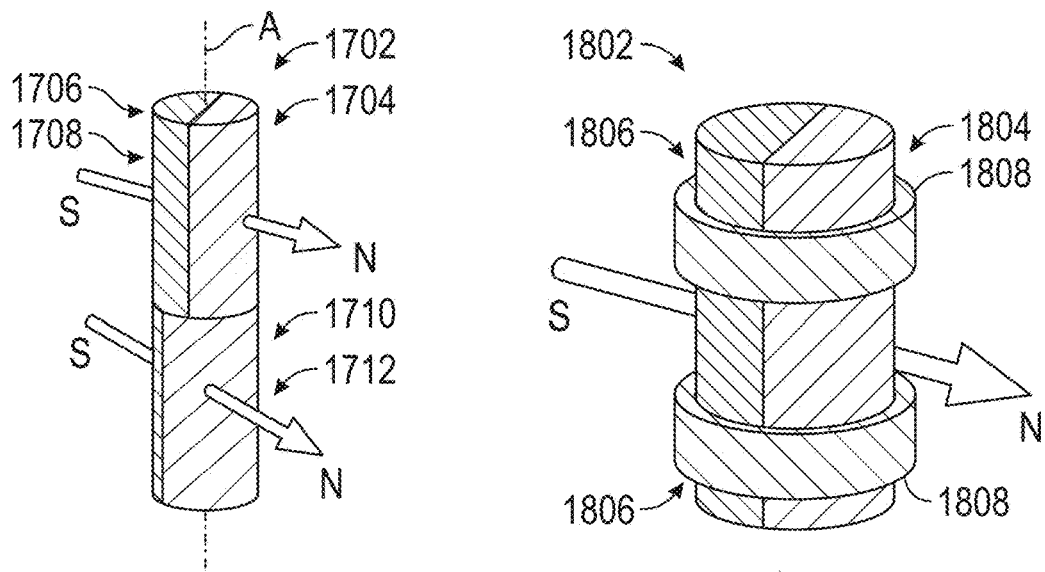
FIG. 21
FIG. 22

MAGNETIZABLE PARTICLES FORMING LIGHT CONTROLLING STRUCTURES AND METHODS OF MAKING SUCH STRUCTURES

TECHNICAL FIELD

This document pertains generally, but not by way of limitation, to magnetizable particles, structures formed of the magnetizable particles for the control of light, and related apparatuses and methods of making such structures.

BACKGROUND

Light control films (LCF) are optical films configured to regulate the transmission of light. Typical LCFs include a light transmissive film having a plurality of parallel grooves, which are formed of a light-absorbing material.

LCFs known in the art control visible light and are used in conjunction with the control of light available to displays. For example, LCFs can be placed proximate a display surface, image surface, or other surface to be viewed. At normal incidence, (i.e. 0 degree viewing angle) where a viewer is looking at an image through the LCF in a direction that is perpendicular to the film surface, the image is viewable. As the viewing angle increases, the amount of light transmitted through the LCF decreases until an external viewing cutoff angle is reached where substantially all (greater than about 95%) the light is blocked by the light-absorbing material and the image is no longer viewable. The LCF provides privacy to a viewer by blocking observation by others that are outside a typical range of viewing angles.

Traditionally, LCFs can be prepared by molding and ultraviolet curing a polymerizable resin on a polycarbonate substrate. Such LCFs are commercially available from 3M Company, St. Paul, Minn., under the trade designation "3M™ Privacy Filters for Notebook Computers and LCD Monitors." These forming processes can be intensive and costly.

Overview

The present disclosure relates to magnetizable particles that can be used as part of LCFs. The magnetizable particles can be positioned, aligned and/or oriented relative to one another within a resin using a magnetic field to form a desired structure(s) for light control.

Considering the processing and costs associated with traditional LCFs, the present inventors have recognized, among other things, that LCFs can benefit from the use of magnetizable particles which can be arranged into the desired structure at lower cost. As such, the present inventors have developed processes and apparatuses that vary the magnetic field to control the magnetizable particles orientation, position, and/or alignment relative to one another to form the desired structure. More particularly, the present inventors have discovered that an applied magnetic field when varied by rotating modulation relative to the magnetizable particles can be used to achieve the desired structure for the plurality of magnetizable particles in the resin. Once such desired structure for the plurality of magnetizable particles within the resin has been achieved, a viscosity of the resin can be increased such as by partially curing or fully curing the resin. Varying of the magnetic field can be accomplished by multiple processes some of which are described in the embodiments that follow. The processes can achieve the desired structure for the plurality of magnetizable particles.

According to one exemplary embodiment, a method of making an optical film for control of light can optionally comprise: positioning a first mixture on a substrate, wherein the first mixture comprises a first plurality of magnetizable particles dispersed in a first resin, assembling the first plurality of magnetizable particles into a desired structure for the control of the light by rotating modulation of at least a first magnetic field relative to the first plurality of magnetizable particles, and vitrifying the first resin while the first plurality of magnetizable particles are in the desired structure.

According to another embodiment, a method of making an optical film for control of light can optionally comprise: providing a substrate, a first mixture including a first plurality of magnetizable particles dispersed in a first resin and a second mixture including a second plurality of magnetizable particles dispersed in a second resin, assembling the first plurality of magnetizable particles into a first desired structure for the control of the light by rotating modulation of at least a first magnetic field relative to the first plurality of magnetizable particles, vitrifying the first resin with the first plurality of magnetizable particles assembled in the first desired structure, assembling the second plurality of magnetizable particles into a second desired structure for the control of the light by rotating modulation of at least a second magnetic field relative to the second plurality of magnetizable particles, and vitrifying the second resin with the second plurality of magnetizable particles assembled in the second desired structure.

In yet another embodiment, a method of making an optical film for control of light can optionally comprising: positioning a first magnet relative to a web containing at least a first mixture of a first plurality of magnetizable particles dispersed in a first resin, rotating the first magnet about an axis such that a north pole and a south pole of the first magnet alternatively pass in proximity of the web, passing the web adjacent the first magnet such that the first plurality of magnetizable particles are influenced by a magnetic field of the first magnet and form a desired structure as affected by the first magnetic field, wherein the desired structure is configured to control the light, and vitrifying the first resin to capture the first plurality of magnetizable particles in the desired structure.

As used herein:

The term "a", "an", and "the" are used interchangeably with "at least one" to mean one or more of the elements being described.

The term "and/or" means either or both. For example, "A and/or B" means only A, only B, or both A and B.

The terms "including," "comprising," or "having," and variations thereof, are meant to encompass the items listed thereafter and equivalents thereof as well as additional items.

Unless specified or limited otherwise, the term "coupled", "positioned" or "deposited" and variations thereof are used broadly and encompass both direct and indirect coupling, positioning, depositing, etc.

The term "adjacent" refers to the relative position of two elements, such as, for example, two layers, that are close to each other and may or may not be necessarily in contact with each other or that may have one or more layers separating the two elements as understood by the context in which "adjacent" appears.

The term "immediately adjacent" refers to the relative position of two elements, such as, for example, two layers, that are next to each other and in contact with each other and have no intermediate layers separating the two elements. The term "immediately adjacent," however, encompasses situations where one or both elements (e.g., layers) have been treated with a primer, or whose surface has been modified to affect the properties thereof, such as etching, embossing, etc., or by surface treatments, such as corona or plasma treatment, etc. that may improve adhesion.

The term "optically clear" as used herein refers to an item (e.g., a film) in a given region of the electromagnetic spectrum (e.g., visible, infrared, radio, or any other range) that has a luminous transmittance of higher than 20% and that exhibits a haze value lower than 40%. Both the luminous transmission and the total haze can be determined using, for example, a BYK Gardner Haze-gard Plus (Catalog No. 4725) according to the method of ASTM-D 1003-13, Procedure A (Hazemeter).

The term "film" as used herein refers, depending on the context, to either a single layer article or to a multilayer construction, where the different layers have been processed according to the techniques described herein.

The term "transmittance" as used herein refers to the percentage of energy in a given region of the electromagnetic spectrum (e.g., visible, infrared, or any other range) that is transmitted across a surface. Transmittance is measured in accordance with the method described in ASTM 1348-15.

The phrase "major surface" or variations thereof, are used to describe an article such as a web having a thickness that is small relative to its length and width. The length and width of such articles can define the "major surface" of the article, but this major surface, as well as the article, need not be flat or planar. For example, the above phrases can be used to describe an article having a first ratio ($R_1$) of thickness (e.g., in a Z direction that is orthogonal to a major surface of the article at any point along the major surface) to a first surface dimension of the major surface (e.g., width or length), and a second ratio ($R_2$) of thickness to a second surface dimension of the major surface, where the first ratio ($R_1$) and the second ratio ($R_2$) are both less than 0.1. In some embodiments, the first ratio ($R_1$) and the second ratio ($R_2$) can be less than 0.01; in some embodiments, less than 0.001; and in some embodiments, less than 0.0001. Note that the two surface dimensions need not be the same, and the first ratio ($R_1$) and the second ratio ($R_2$) need not be the same, in order for both the first ratio ($R_1$) and the second ratio ($R_2$) to fall within the desired range. In addition, none of the first surface dimension, the second surface dimension, the thickness, the first ratio ($R_1$), and the second ratio ($R_2$) need to be constant in order for both the first ratio ($R_1$) and the second ratio ($R_2$) to fall within the desired range.

The term "light" includes one or more forms of light, alone or in combination, including, but not limited to, visible light, ultraviolet light and infrared light and radio frequency electromagnetic waves.

The terms "control of light", "light control" or the like means an optical film that is configured to regulate transmission of light through the optical film. In some embodiments, the transmission of light will be through the optical film to a substrate.

The term "ferrimagnetic" refers to materials that exhibit ferrimagnetism. Ferrimagnetism is a type of permanent magnetism that occurs in solids in which the magnetic fields associated with individual atoms spontaneously align themselves, some parallel, or in the same direction (as in ferromagnetism), and others generally antiparallel, or paired off in opposite directions (as in antiferromagnetism). The magnetic behavior of single crystals of ferrimagnetic materials can be attributed to the parallel alignment; the diluting effect of those atoms in the antiparallel arrangement keeps the magnetic strength of these materials generally less than that of purely ferromagnetic solids such as metallic iron. Ferrimagnetism occurs chiefly in magnetic oxides known as ferrites. The spontaneous alignment that produces ferrimagnetism is entirely disrupted above a temperature called the Curie point, characteristic of each ferrimagnetic material. When the temperature of the material is brought below the Curie point, ferrimagnetism revives.

The term "magnet" can include a ferromagnetic material that responds to a magnetic field and acts as a magnet. "Magnet" can be any material that exerts a magnetic field in either a permanent, semi-permanent, or temporary state. The term "magnet" can be one individual magnet or an assembly of magnets that would act like a single magnet. The term "magnet" can include permanent magnets and electromagnets.

The term "ferromagnetic" refers to materials that exhibit ferromagnetism. Ferromagnetism is a physical phenomenon in which certain electrically uncharged materials strongly attract others. In contrast to other substances, ferromagnetic materials are magnetized easily, and in strong magnetic fields the magnetization approaches a definite limit called saturation. When a field is applied and then removed, the magnetization does not return to its original value. This phenomenon is referred to as hysteresis. When heated to a certain temperature called the Curie point, which is generally different for each substance, ferromagnetic materials lose their characteristic properties and cease to be magnetic; however, they become ferromagnetic again on cooling.

The terms "magnetic" and "magnetized" mean being ferromagnetic or ferrimagnetic at 20° C., unless otherwise specified.

The term "magnetizable" means that the item being referred to is magnetic or can be made magnetic using an applied magnetic field and has a magnetic moment of at least 0.001 electromagnetic units (emu), in some cases at least 0.005 emu, and yet other cases 0.01 emu, up to an including 0.1 emu, although this is not a requirement. The term "magnetizable" means capable of being magnetized or already in a magnetized state.

The term "magnetic field" refers to magnetic fields that are not generated by any astronomical body or bodies (e.g., Earth or the sun). In general, magnetic fields used in practice of the present disclosure have a field strength in the region of the magnetizable particles being oriented of at least about 10 gauss (1 mT), in some cases at least about 100 gauss (10 mT), and in yet other cases at least about 1000 gauss (0.1 T), and in yet other cases at least about 10,000 gauss (1.0 T).

The term "rotation" refers to angular displacement that is a portion of or an entire revolution or several revolutions.

The term "length" refers to the longest dimension of an object.

The term "width" refers to the longest dimension of an object that is perpendicular to its length.

The term "thickness" refers to the longest dimension of an object that is perpendicular to both of its length and width.

The term "aspect ratio" refers to the ratio length/thickness of an object.

The term "orientation", "orient" "orienting" or "oriented" as it refers to the magnetizable particles provided by the magnetic field(s) of the present disclosure can refer to a non-random disposition of at least a majority of the particles relative to the substrate (sometimes referred to as a backing herein). For example, a majority of the magnetizable particles have a major planar surface disposed at an angle of at least 70 degrees relative to the first major surface of the substrate after application of the magnetic field. These terms can also refer to major axes and dimensions of the magnetizable particles themselves. For example, the particle maximum length, width and thickness are a function of a shape of the magnetizable particle, and the shape may or may not be uniform. The present disclosure is in no way limited to any particular particle shape, dimensions, type, etc., and many exemplary magnetizable particles useful with the present disclosure are described in greater detail below. However, with some shapes, the "height", "width" and "thickness" give rise to major faces and minor side faces. Regardless of an exact shape, any magnetizable particle can have a centroid at which particle local Cartesian axes as shown in FIG. 1 u (length), v (width), and w (thickness) can be defined. With these conventions, the particle w-axis is parallel with the maximum height, the particle u-axis is parallel with the maximum length, and the particle v-axis is parallel with the maximum thickness of the particle. As a point of reference, the particle axes can identified for each magnetizable particle as a standalone object independent of the backing construction; each particle (along with the particle's local (uvw) coordinate system) can be manipulated by a magnetic field to cause the particle to achieve a desired orientation relative to a global (xyz) coordinate system, where the x-axis is down-web (length), the y-axis is cross-web (width), and the z-axis is normal to the xy-plane (thickness) Refer to FIG. 3 and additional FIGS. 2-23B. Once applied to the backing, a "z-axis rotation orientation" of the magnetizable particle is defined by the particle's angular rotation about a z-axis passing through the particle and normal to the backing. The orientation effected by the magnetic field(s) of the present disclosure can entail application of the magnetic field to alter or otherwise change a spatial arrangement of at least a majority of the plurality of the magnetizable particles relative to the substrate and/or on a particle level to a desired range of rotational orientations about the particle in one or more of the z-axis, the y-axis and/or the x-axis to a range of rotational orientations about the particle axes.

The term "position", "positioning", "position" or "position" as it refers to magnetizable particles provided by the magnetic field(s) of the present disclosure can refer to a non-random disposition of at least a majority of the particles relative to one another. For example, a majority of the magnetizable particles may be spaced a desired distance apart in at least one axis after application of the magnetic field.

The term "alignment" "aligning" "aligned" or "align" as it refers to the magnetizable particles provided by the magnetic field(s) of the present disclosure can refer to a non-random positioning of at least a majority of the magnetizable particles. Specifically, having "alignment" can position a majority of the magnetizable particles such that a majority of the magnetizable particles have major surfaces that are substantially parallel with one another substantially perpendicular to one another, and/or are oriented at a desired angle with respect to one another.

The term "desired structure" means a structure formed from a plurality of magnetizable particles where at least a majority of the plurality of particles have one or more of an orientation, position, and/or alignment relative to one another and/or the substrate that has been affected by application of the magnetic field(s).

The term "vitrification" "vitrified" "vitrifying" or "vitrify" as it refers to the resin mixture containing the magnetizable particles means increasing the viscosity of the resin mixture so as to enable at least a majority of the magnetizable particles maintain their desired structure after application of the magnetic field(s). Vitrification may be only partially accomplished to a sufficient amount so as to enable at least a majority of the magnetizable particles maintain their desired structure after application of the magnetic field(s). Vitrification may occur via polymerization (e.g. radiation curable or thermally curable resin systems), solidification through removal of thermal energy (e.g. solidification of a polymer melt), or evaporation of a solvent from the resin mixture. The terms "Cure", "Cure 1" and "Cure 2" as used in this document are all vitrification processes.

All scientific and technical terms used herein have meanings commonly used in the art unless otherwise specified. The definitions provided herein are to facilitate understanding of certain terms used frequently in this application and are not meant to exclude a reasonable interpretation of those terms in the context of the present disclosure.

Unless otherwise indicated, all numbers in the description and the claims expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviations found in their respective testing measurements.

The term "substantially" means within 20 percent (in some cases within 15 percent, in yet other cases within 10 percent, and in yet other cases within 5 percent) of the attribute being referred to. Thus, a value A is "substantially similar" to a value B if the value A is within plus/minus one or more of 5%, 10%, 20% of the value A.

Features and advantages of the present disclosure will be further understood upon consideration of the detailed description as well as the appended claims.

The recitation of numerical ranges by endpoints includes all numbers subsumed within that range (e.g. a range from 1 to 5 includes, for instance, 1, 1.5, 2, 2.75, 3, 3.80, 4, and 5) and any range within that range.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 1 is a schematic perspective view of a magnetizable particle according to one embodiment of the present disclosure.

FIG. 1A is an enlarged view of region 1A in FIG. 1.

FIG. 2 is an image of a plurality of magnetizable particles arranged with a desired structure due to the application of a magnetic field on a substrate according to an example of the present disclosure.

FIG. 3 is schematic view of a first method of making an optical film, the method varies a magnetic field by rotating modulation and applies a cure, wherein under the influence of the magnetic field, the plurality of magnetizable particles assume a desired structure according to an example of the present disclosure.

FIG. 4A is a schematic view showing the magnet of FIG. 4 with the magnetic field having rotating modulating as a result of rotation of the magnet according to an example of the present disclosure.

FIG. 5(a)-5(c) are arrangements of a plurality of magnetizable particles relative to one another cross-web, down-web and thickness direction according to an example of the present disclosure.

FIGS. 19 and 20 show examples of the one or more features being imparted to the optical film.

FIG. 21 shows a magnet assembly according to one embodiment where a first portion of the magnet assembly has been rotated relative to a second portion of the magnetic field such that the poles of the first and second portions do not align perfectly, this arrangement for the magnet assembly provides for localized irregularities in the magnetic field according to an example of the present application.

FIG. 22 shows a magnet assembly according to another embodiment that has an irregular diameter with sections having a larger diameter providing for flux concentrations according to an example of the present application.

DETAILED DESCRIPTION

Figure 3A:
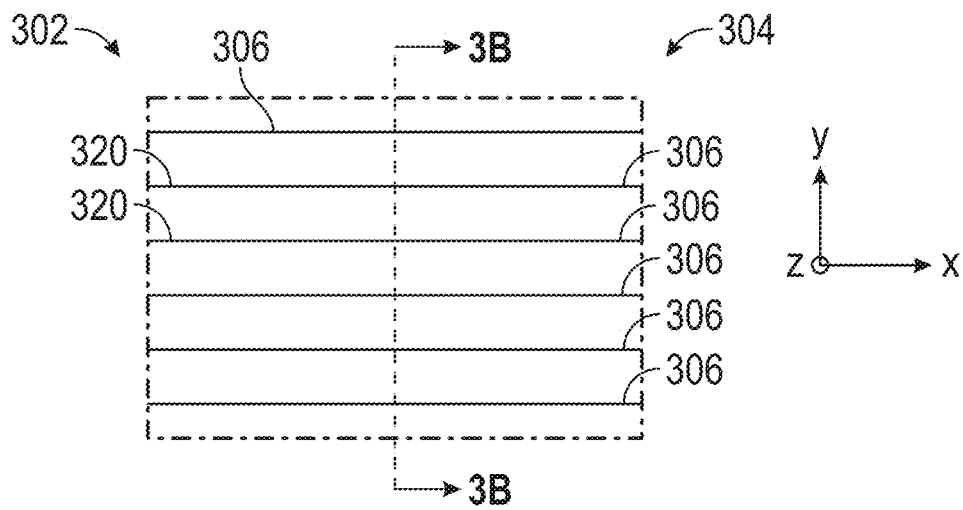
FIG. 3A is the desired structure of the plurality of magnetizable particles that results from the magnetic field of the method of FIG. 3 according to an example of the present disclosure.

Magnetizable particles are described herein by way of example and can have various configurations. For example, the magnetizable particles can be constructed of various materials including but not limited to ceramics, metal alloy powder, metal alloys, glass particles coated to be magnetizable, composites or the like. Similarly, the magnetizable particles can be substantially entirely constructed of magnetizable material, can have magnetizable portions disposed therein (e.g., ferrous traces), or can have magnetizable portions disposed as layers on one or more surfaces thereof (e.g., one or more surfaces can be coated with a magnetizable material) according to some examples. The magnetizable particles can be shaped according to some examples, such as shown in the example of FIG. 1. According to other examples the magnetizable particles can comprise, flakes, crush grains, agglomerates, or the like. Magnetizable particles can be used in loose form (e.g., free-flowing or in a slurry) prior to cure and can be incorporated into various articles including the optical films discussed herein.

Referring now to FIGS. 1 and 1A, an exemplary magnetizable particle 100 is disclosed. The magnetizable particle 100 can have a shaped body 110 that has been coated with a magnetizable material 120. According to some examples, the body 110 need not be shaped but can be random. Furthermore, the body 110 can be formed of a magnetizable material and need not be coated. The magnetizable material 120 can be comprised of magnetizable particles 125 (e.g., iron) retained in a binder matrix 130 (also referred to simply as "binder") as further shown in FIG. 1A. If shaped, as it need not be in many embodiments, but as shown in the embodiment of FIG. 1, the body 110 can have two opposed major surfaces 160, 162 connected to each other by four minor side surfaces 140*a*, 140*b*, 140*c* and 140*d*. Magnetizable particles of the type shown can be moveable to align with magnetic field lines of force as will be discussed subsequently to form desired structures.

The magnetizable material 120 can be a unitary magnetizable material, or it can comprise magnetizable particles in a binder matrix. Suitable binders can be vitreous or organic, for example, as described for the binder matrix 130 hereinbelow. The binder matrix can be, for example selected from those vitreous and organic binders. The body 110 can comprise ferrous materials or non-ferrous material(s), for example.

If the magnetizable material comprises a layer coated on the particle 100 as shown in the embodiment of FIG. 1, this can be accomplished by any suitable method such as, for example, dip coating, spraying, painting, physical vapor deposition, and powder coating. Individual magnetizable particles can have magnetizable layers with different degrees of coverage and/or locations of coverage. The magnetizable material can be essentially free of (i.e., containing less than 5 weight percent of, in yet other cases containing less than 1 weight percent of) materials used in the shaped body 110. The magnetizable layer can consist essentially of magnetizable materials (e.g., >99 to 100 percent by weight of vapor coated metals and alloys thereof), or it can contain magnetizable particles retained in a binder matrix. The binder matrix of the magnetizable layer, if present, can be inorganic (e.g., vitreous) or organic resin-based, and is typically formed from a respective binder precursor.

Magnetizable particles according to the present disclosure can be prepared, for example, by applying a magnetizable layer or precursor thereof to the body 110. Magnetizable layers can be provided by physical vapor deposition as discussed hereinbelow. Magnetizable layer precursors can be provided as a dispersion or slurry in a liquid vehicle. The dispersion or slurry vehicle and can be made by simple mixing of its components (e.g., magnetizable particles, optional binder precursor, and liquid vehicle), for example. Exemplary liquid vehicles include water, alcohols (e.g., methanol, ethanol, propanol, butanol, ethylene glycol monomethyl ether), ethers (e.g., glyme, diglyme), and combinations thereof. The dispersion or slurry can contain additional components such as, for example, dispersant, surfactant, mold release agent, colorant, defoamer, and rheology modifier. Typically, after coating onto the ceramic bodies the magnetizable layer precursor is dried to remove most or all of the liquid vehicle, although this is not a requirement. If a curable binder precursor is used, then a curing step (e.g., heating and/or exposure to actinic radiation) generally follows to provide the magnetizable layer.

Vitreous binder can be produced from a precursor composition comprising a mixture or combination of one or more raw materials that when heated to a high temperature melt and/or fuse to form a vitreous binder matrix. Further disclosure of appropriate vitreous binders that can be used with the article can be found in PCT Publication Nos. WO 2018/080703, WO 2018/080756, WO 2018/080704, WO 2018/080705, WO 2018/080765, WO 2018/080784, WO 2018/080755, and WO 2018/080799, which are each incorporated herein by reference in their entirety.

In some embodiments, the magnetizable layer can be deposited using a vapor deposition technique such as, for example, physical vapor deposition (PVD) including magnetron sputtering. PVD metallization of various metals, metal oxides and metallic alloys is disclosed in, for example, U.S. Pat. No. 4,612,242 (Vesley) and U.S. Pat. No. 7,727, 931 (Brey et al.). Magnetizable layers can typically be prepared in this general manner.

As discussed previously, the body of the magnetizable particle can be shaped (e.g., precisely-shaped) or random (e.g., flake, crushed, sphere, etc.). Exemplary shapes include squares, spheres, rectangles, pyramids (e.g., 3-, 4-, 5-, or 6-sided pyramids), truncated pyramids (e.g., 3-, 4-, 5-, or 6-sided truncated pyramids), cones, truncated cones, rods (e.g., cylindrical, vermiform), and prisms (e.g., 3-, 4-, 5-, or 6-sided prisms).

Exemplary magnetizable materials that can be suitable for use in magnetizable particles can comprise: iron; cobalt; nickel; various alloys of nickel and iron marketed as Permalloy in various grades; various alloys of iron, nickel and cobalt marketed as Fernico, Kovar, FerNiCo I, or FerNiCo II; various alloys of iron, aluminum, nickel, cobalt, and sometimes also copper and/or titanium marketed as Alnico in various grades; alloys of iron, silicon, and aluminum (typically about 85:9:6 by weight) marketed as Sendust alloy; Heusler alloys (e.g., $Cu_2MnSn$); manganese bismuthide (also known as Bismanol); rare earth magnetizable materials such as gadolinium, dysprosium, holmium, europium oxide, alloys of neodymium, iron and boron (e.g., $Nd_2Fe_{14}B$), and alloys of samarium and cobalt (e.g., $SmCo_5$); MnSb; $MnOFe_2O_3$; $Y_3Fe_5O_{12}$; $CrO_2$; MnAs; ferrites such as ferrite, magnetite; zinc ferrite; nickel ferrite; cobalt ferrite, magnesium ferrite, barium ferrite, and strontium ferrite; yttrium iron garnet; and combinations of the foregoing. In some embodiments, the magnetizable material comprises at least one metal selected from iron, nickel, and cobalt, an alloy of two or more such metals, or an alloy of at one such metal with at least one element selected from phosphorus and manganese. In some embodiments, the magnetizable material is an alloy (e.g., Alnico alloy) containing 8 to 12 weight percent (wt. %) aluminum, 15 to 26 wt. % nickel, 5 to 24 wt. % cobalt, up to 6 wt. % copper, up to 1 wt. % titanium, wherein the balance of material to add up to 100 wt. % is iron.

The magnetizable particles can have a major dimension of any size relative to a thickness or the optical films they are a part of but can be much smaller than the thickness of the optical films in some instances. For example, they can be 1 to 2000 times smaller in some embodiments, in yet other embodiments 100 to 2000 times smaller, and in yet other embodiments 500 to 2000 times smaller, although other sizes can also be used.

FIG. 2 is a photograph of an optical film 200 with a plurality of magnetizable particles 202 that have been organized into a desired structure with a majority of the magnetizable particles exhibiting a non-random positioning along lines of force due to the application of a magnetic field. As shown in FIG. 2, at least a majority of the plurality of magnetizable particles 202 are aligned and spaced into a desired structure 204 having distinctive rows. In FIG. 2, the plurality of magnetizable particles 202 comprise Sendust. The Sendust particles account for substantially 20% of the optical film by weight percentage and are applied as a slurry onto a substrate. The Sendust particles are initially dispersed in the optically clear resin in a random manner. Types of resin families include but are not limited to: a combination of a first and a second polymerizable component selected from (meth)acrylate monomers and (meth)acrylate oligomers, and mixtures thereof. As used herein, "monomer" or "oligomer" is any substance that can be converted into a polymer. The term "(meth)acrylate" refers to both acrylate and methacrylate compounds. In some cases, the polymerizable composition can comprise a (meth)acrylated urethane oligomer, (meth)acrylated epoxy oligomer, (meth)acrylated polyester oligomer, a (meth)acrylated phenolic oligomer, a (meth)acrylated acrylic oligomer, and mixtures thereof. The polymerizable resin optionally, yet preferably further comprises at least one crosslinker having three or more (meth) acrylate groups. The polymerizable composition may optionally include a (e.g. monofunctional) reactive diluent. The polymerizable resin can be a radiation curable polymeric resin, such as a UV curable resin. Radiation (e.g. UV) curable compositions generally include at least one photoinitiator. The photoinitiator or combination of photoinitiators can be used at a concentration of about 0.1 to about 10 weight percent. More preferably, the photoinitiator or combination thereof is used at a concentration of about 0.2 to about 3 weight percent. In general the photoinitiator(s) are at least partially soluble (e.g. at the processing temperature of the resin) and substantially colorless after being polymerized. The photoinitiator may be (e.g. yellow) colored, provided that the photoinitiator is rendered substantially colorless after exposure to the UV light source. Types of resin families can also include but are not limited to: a polymerizable resin comprised of high polymers, epoxides and/or siloxanes.

The resin can be at least partially cured after the Sendust particles are organized into the desired structure by the applied magnetic field. Due to the high aspect ratio of the Sendust flakes, there can be initially little to no transmission through the slurry prior to organization by the magnetic field. Once the magnetic field is applied, the Sendust particles are organized into the desired structure, with the field lines orienting the Sendust particles (comprising flakes) upward and aligning them relative to one another. This desired structure achieves the ability of light transmission through the optical film 200 in the normal direction (parallel to the z-axis) and any angle in the x-z plane but also limits light transmission at oblique angles to the optical film 200 (in the y-z plane). The angle at which light is blocked as well as the magnitude of how quickly the transmission is reduced from when the optical film is angled away from perpendicular to the viewing direction, can be controlled by the percent loading by weight of Sendust to optically clear resin and other techniques and features that affect the construct of the optical film as will be discussed in greater detail subsequently.

FIG. 3 shows a method 300 for making an optical film 302 according to one embodiment of the present disclosure. FIG. 3A shows a desired structure 304 of the plurality of magnetizable particles 306 that results from the magnetic field of the method of FIG. 3. It should be noted that in FIG. 3A, and in the subsequently shown and described methods and the desired structures of FIGS. 4-29A, that the desired structures, methods and optical films are shown on a larger scale (high level) such that individual of the plurality of magnetizable particles are not specifically shown. Thus, each row (shown as a line) of the desired structures will be comprised of some of the plurality of the magnetizable particles. It should be recognized that the desired structures are comprised of the plurality of magnetizable particles, which may be spaced from one another even when grouped in rows along lines of force as shown in FIG. 2. It should be further recognized that for the disclosed methods a majority (or more) of the plurality of magnetizable particles may exhibit the desired structure and the desired structures shown herein are shown in a highly schematic manner that does not show some degree of randomness that can occur in the orientation, alignment and/or positioning of at least some (less than a majority) of the plurality of magnetizable particles. This randomness is shown in some areas of the optical film of FIG. 2.

Figure 3B:
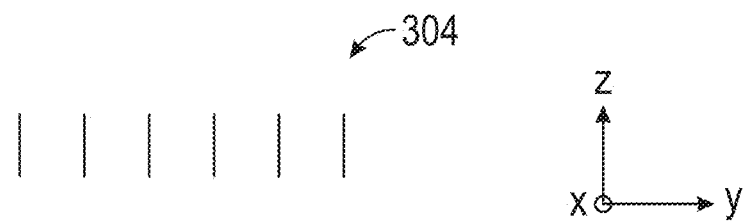
FIG. 3B is a cross-sectional view of FIG. 3A along the line at 3B-3B in FIG. 3A.

The method 300 is operable to provide the plurality of magnetizable particles 306 with the desired structure 304 within the optical film 302 as shown in FIG. 3A. FIG. 3B shows a cross-section of FIG. 3A showing the desired structure 304 from another perspective. The plurality of magnetizable particles 306 can have a construction similar to those previously illustrated or described. According to one embodiment and now referencing FIG. 3, the magnetizable particles can be dispersed in an optically clear resin (in the electromagnetic spectrum range of interest) to form a first mixture 308. The optically clear resin can have a composition the same as the examples provided in reference to FIG. 2. The first mixture 308 can be positioned on a web 310 (comprising a substrate 312). The plurality of magnetizable particles 306 can be by weight percentage anywhere from 0.01% to 90% relative to the weight percentage of the resin. The particular chemical composition and thickness of the substrate 312 can depend on the requirements of the particular optical product that is being constructed. That is, balancing the needs for strength, clarity, temperature resistance, surface energy, adherence to the optical layer, among others. The thickness of the substrate 312 is typically at least about 0.025 millimeters (mm) and more typically at least about 0.125 mm. Further, the substrate 312 generally has a thickness of no more than about 0.5 mm.

Useful substrate materials include, for example, styrene-acrylonitrile, cellulose acetate butyrate, cellulose acetate propionate, cellulose triacetate, polyether sulfone, polymethyl methacrylate, polyurethane, polyester, polycarbonate, polyvinyl chloride, polystyrene, polyethylene naphthalate, copolymers or blends based on naphthalene dicarboxylic acids, polyolefin-based material such as cast or orientated films of polyethylene, polypropylene, and polycyclo-olefins, polyimides, and glass. Optionally, the substrate material can contain mixtures or combinations of these materials. In an embodiment, the substrate may be multi-layered or may contain a dispersed component suspended or dispersed in a continuous phase.

Further examples of substrates include polyethylene terephthalate (PET) and polycarbonate. Examples of useful PET films include photograde polyethylene terephthalate and available from DuPont Films of Wilmington, Del. under the trade designation "Melinex 618".

Optionally, a second substrate (which can be similar or dissimilar in composition and thickness as the first substrate 312) may be laminated (e.g. bonded using an optically clear adhesive) to the optical film 302 to provide improve clarity, to protect the optical layer 304, to provide a desired physical property to the optical film 302, etc.

The first mixture 308 can be applied up-web of a magnet 314 (permanent or electromagnet). The magnet 314 can be placed in close proximity (within a few feet) of the web 310 containing the first mixture 308 of the plurality of magnetizable particles 306 and resin. A Cartesian coordinate system is provided in FIGS. 3 and 3B to aid in understanding the positioning of the web 310 relative to the magnet 314 and in understanding the desired structure 304 of FIG. 3A. According to the embodiment shown, the Cartesian coordinate system provided can have an axis (x-axis) oriented in the down-web/up-web direction. The (y-axis) substantially aligns with a cross-web direction of the web 310 and with an axis of rotation AR of the magnet 314. The (z-axis) substantially aligns normal to both of the x-axis and y-axis.

Figure 4:
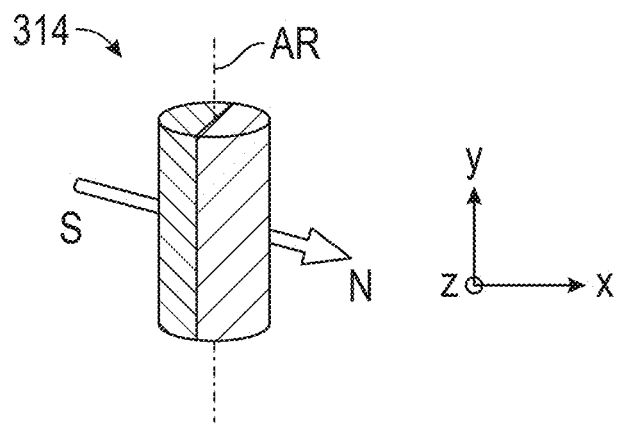
FIG. 4 is a schematic view of one example of a magnet that can create the magnet fields discussed in the present disclosure.

As shown in the example of FIG. 3, the magnet 314 is rotated about the axis of rotation AR relative to the web 310. The rotational speed of the magnet can be between 100 to 10,000 rpm or more. The web 310 can translate relative to the magnet 314 as indicated by arrow 316. FIGS. 4 and 4A show construction of the magnet 314 in further detail. FIG. 4 shows the magnet 314 can include two poles N and S that are each shaped as hemispheres and are disposed to either side of the axis of rotation AR. FIG. 4A shows a magnetic field 318 that is generated by the magnet 314 and rotating modulation of the magnetic field 318 that results from rotation of the magnet 314 about the axis of rotation AR (FIGS. 3 and 4). The optical film 302 and other details of the method 300 of FIG. 3 are not shown in FIG. 4A. The resolved line of force that would be exerted on the plurality of magnetizable particles 306 is indicated by arrows A in FIG. 4A.

Further examples of magnetic field configurations and apparatuses for generating them are described in U.S. Patent Application. Publication. Nos. 2008/0289262 A1 (Gao) and U.S. Pat. No. 2,370,636 (Carlton), U.S. Pat. No. 2,857,879 (Johnson), U.S. Pat. No. 3,625,666 (James), U.S. Pat. No. 4,008,055 (Phaal), U.S. Pat. No. 5,181,939 (Neff), and British Pat. No. GB 1 477 767 (Edenville Engineering Works Limited), which are each incorporated herein by reference in their entirety.

Returning now to FIG. 3, according to the example embodiment, the magnet 314 is positioned to extend across a full cross-web extend of the web 310 in the y-axis direction of the Cartesian coordinate system provided. However, in some embodiments the magnet 314 may not extend the full cross-web length as shown in FIG. 3. FIG. 3 additionally shows the method 300 applies at least one cure to the optical film 302, indicated as Cure 1 in FIG. 3. The Cure 1 is applied in close proximity (within a few inches up-web or down-web) of the magnet 314. The Cure 1 can be applied by any known technique such as, but not limited to, application of ultraviolet light, application of electron beam, application or removal of thermal energy (e.g., applying heating or cooling), for example. As shown in FIG. 4A, as the magnetic field 318 is undergoing rotating modulation, the application of Cure 1 should be applied to the optical film 302 at a particular time and location where the lines of force and resolved force is oriented in a desired manner in order that the plurality of magnetizable particles are in the desired structure 304 (FIG. 3A). The Cure 1 can be a full cure (i.e. full polymerization of the resin can occur) or can be a partial cure with sufficient polymerization such that a majority of the magnetizable particles are in the desired structure 304 (FIG. 3A). With a full cure no second cure (indicated as Cure 2) would be necessary in the method of FIG. 3. FIG. 3 shows the method 300 having a partial cure (Cure 1) and a second cure (Cure 2) at a down-web location to complete full polymerization.

Thus, the method 300 of FIG. 3 can make an optical film for control of light including positioning the first mixture 308 on the substrate 310. The first mixture 308 can comprise the plurality of magnetizable particles 306 dispersed in the first resin. The method 300 can include assembling the plurality of magnetizable particles 306 into the desired structure 304 for the control of the light by rotating modulation of at least the magnetic field 318 relative to the plurality of magnetizable particles 306. The method 300 can further include vitrifying (such as by the Cure 1 and/or the Cure 2 discussed above) to increase a viscosity of the first resin while the plurality of magnetizable particles 306 are in the desired structure 304.

FIG. 3A shows the desired structure 304 at a high level and in a highly schematic manner. As shown in FIG. 3A, the substrate 312 (FIG. 3) can be removed. However, in other embodiments the substrate 312 can be retained. As discussed previously, individual ones of the plurality of magnetizable particles are not shown in FIG. 3A. FIG. 3A shows a configuration for the optical film 302 with the desired structure 304 similar to that of the optical film 200 of FIG. 2. The desired structure 304 is one where the plurality of magnetizable particles are arranged in spaced rows 320 extending generally in the down-web direction. The desired structure 304 is one that allows the optical film 302 to be substantially light transmissive when viewed directly in the orientation shown in FIG. 3A (parallel to the x-z plane). However, the desired structure 304 also limits light transmission at oblique angles to the optical film 302 in the y-z plane (i.e. orthogonal to the view of FIG. 3A not within the xz-plane). It is important to note that the embodiment of FIGS. 3 and 3A is described with application of the first mixture 308 as a single layer on the substrate. However, applications of multiple layers using the same mixture or different mixture compositions are also contemplated, and indeed, are further described and illustrated in this disclosure.

FIGS. 5(a)-5(c) show further potential orientations, positions and alignments of exemplary ones of the plurality of magnetizable particles described herein. FIG. 5(a) shows a particular orientation for particles 402 and 404 with minor surfaces arranged in the z and x directions of the Cartesian coordinate system (same orientation system as utilized in FIGS. 3-4A) and the major surfaces oriented in the y-direction. Such orientation is purely exemplary in nature and is used for ease of reference and description. In the multi-layer orientation of FIG. 5(a) the particles 402 and 404 are stacked and spaced from one another. In some embodiments, the particles 402 and 404 can be configured to be attracted or repelled from one another as indicated by arrow A.

FIG. 5(b) shows particles 406 and 408 that are spaced from one another in a cross-web direction. In some embodiments, the particles 406 and 408 can be configured to be attracted or repelled from one another as indicated by arrow A. FIG. 5(c) shows particles 410 and 412 that are spaced from one another in a cross-web direction. In some embodiments, the particles 410 and 412 can be configured to be attracted or repelled from one another as indicated by arrow A. Multiple arrangements of the plurality of particles (e.g., arrangements of FIG. 5(a), FIG. 5(b) and/or FIG. 5(c) are contemplated, and indeed, are disclosed herein.

Figure 6:
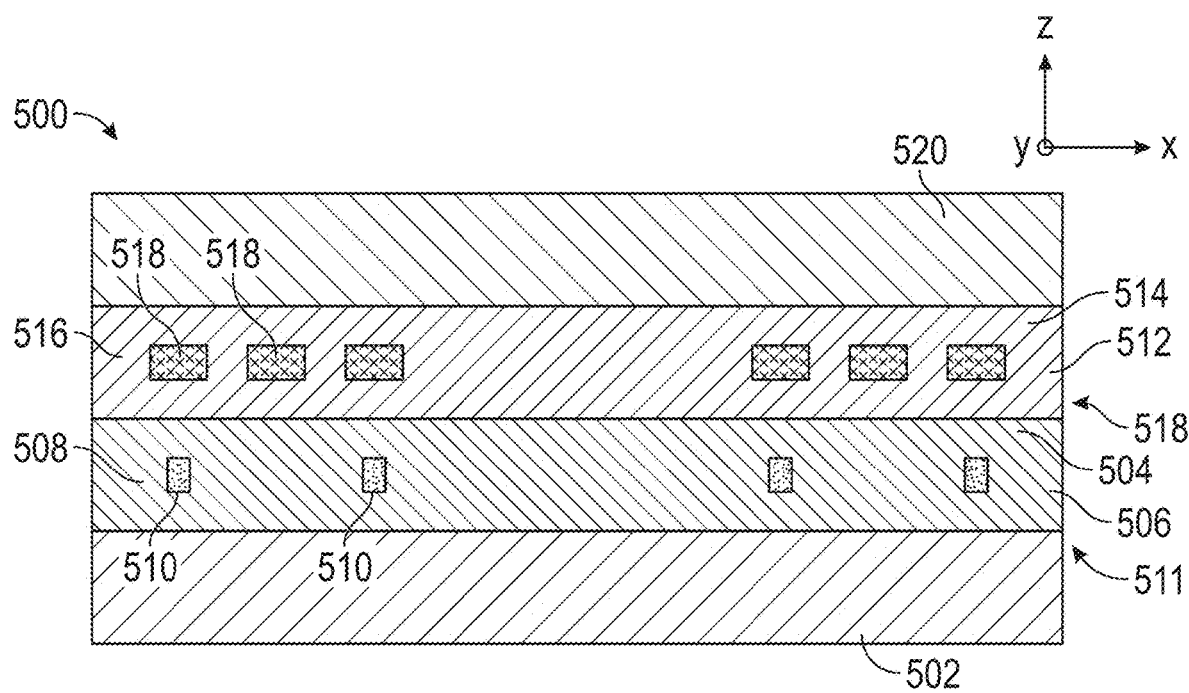
FIG. 6 is a cross-section of an exemplary optical film produced by one of the methods discussed herein and having multiple layers, wherein some of the multiple layers containing a plurality of magnetizable particles according to an example of the present disclosure.

FIG. 6 shows one possible configuration for an optical film 500 having multiple layers. The optical film 500 can have a substrate 502 as previously described and a first layer 504. The first layer 504 can comprise a first mixture 506 of a first optically clear resin 508 and a first plurality of magnetizable particles 510. The first layer 504 can be coupled to the substrate 502 either directly or indirectly. The relative size and spacing of the first plurality of magnetizable particles 510 has been exaggerated for illustration purposes and viewer understanding in FIG. 6. As shown in FIG. 6, the first plurality of magnetizable particles 510 have a first desired structure 511.

In FIG. 6, a second layer 512 can be coupled either directly or indirectly (via a second substrate for example) to the first layer 506. The second layer 512 can comprise a second mixture 514 of a second optically clear resin 516 and a second plurality of magnetizable particles 518. The relative size and spacing of the second plurality of magnetizable particles 518 has been exaggerated for illustration purposes and viewer understanding in FIG. 6. As shown in FIG. 6, the second plurality of magnetizable particles 518 have a second desired structure 519. The second desired structure 518 can differ from or be substantially similar to the first desired structure 511.

As shown in FIG. 6, the first plurality of magnetizable particles 510 can have at least one of a shared first orientation or first common alignment direction relative to the substrate 502 and the second plurality of particles 518 can have at least one of a shared second orientation or second common alignment direction relative to the substrate 502. In FIG. 6, the shared first orientation or first common alignment direction differs from the shared second orientation or second common alignment direction.

Optionally, further layers can be added to the optical film 500 including layers having magnetizable particles with further desired structures. The embodiment of FIG. 6 shows a further layer 520 that can be configured to provide a smooth surface to the optical film 500 along an opposing side of the optical film from the substrate 502. In other cases, the further layer 520 can provide a desired texturing or other physical attributes if desired.

Figure 7:
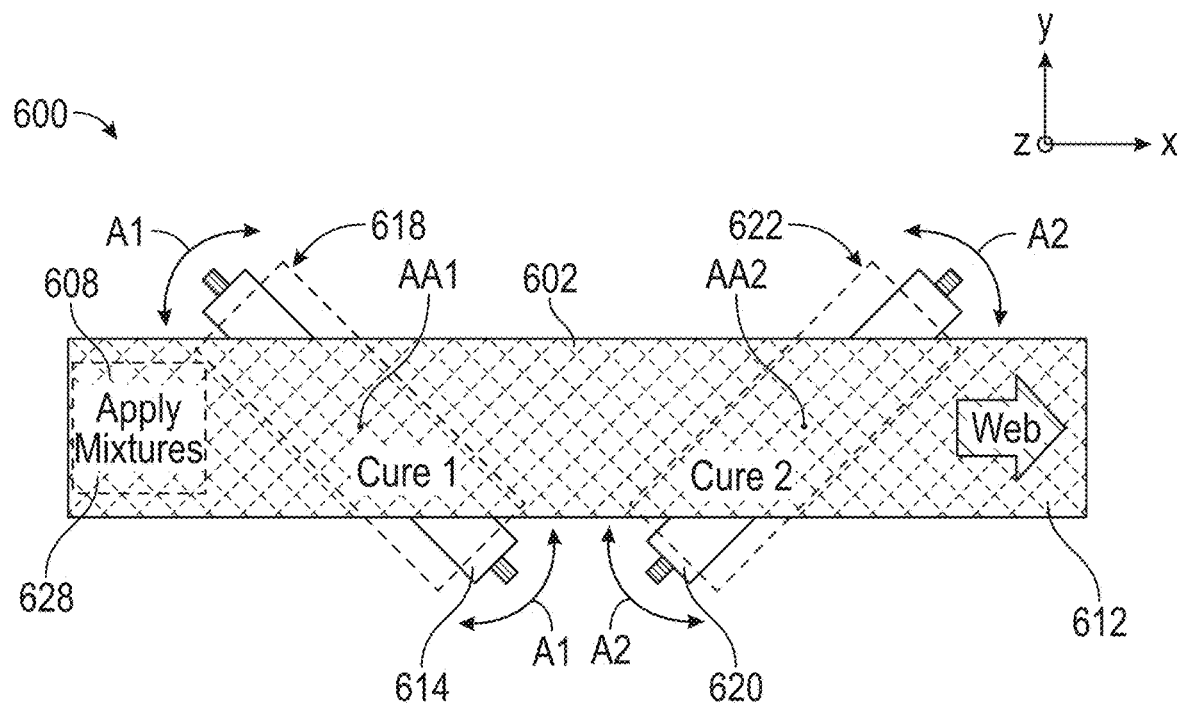
FIG. 7 is schematic view of a second method of forming the optical film using two magnetic fields and two cures where a second plurality of magnetizable particles assume a second desired structure according to an example of the present disclosure.

FIG. 7 shows another method 600 of forming an optical film 602 with at least two layers for control of light. Unless otherwise further indicated for the remainder of this disclosure, the construct and arrangement of the magnet(s), resin (s), magnetizable particles, substrate(s), etc. can be substantially similar to or the same as those previously described herein. Thus, for example, each magnet(s), unless otherwise indicated, undergoes rotation similar to that of the magnet 314 of FIG. 3-4A. Thus, the magnetic field(s) generated by such magnet(s) are subject to rotating oscillation.

Figure 7A:
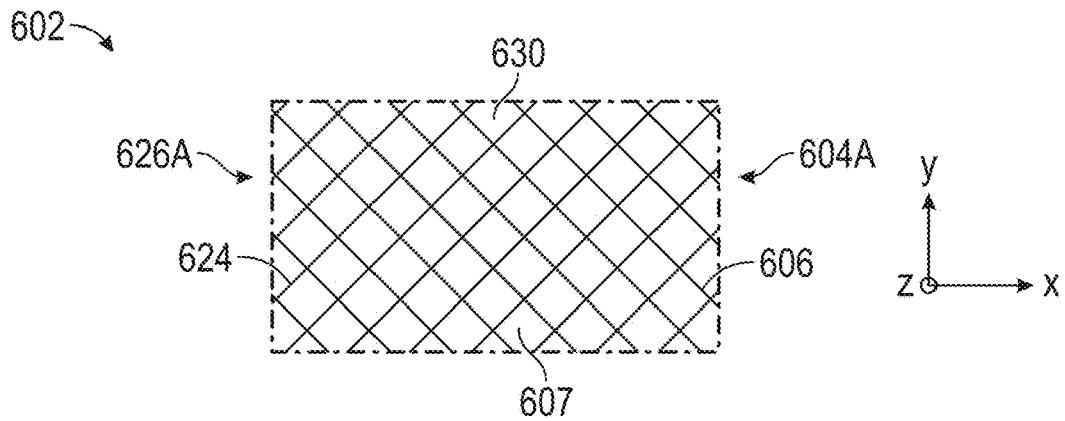
FIG. 7A is the second desired structure for the plurality of magnetizable particles that results from the two magnetic fields of the embodiment method of FIG. 7.
Figure 7B:
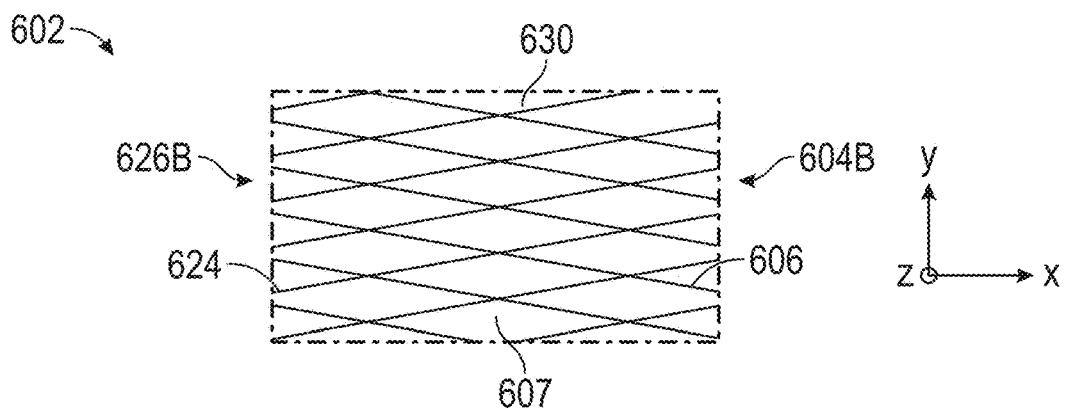
FIG. 7B is a third desired structure for the of magnetizable particles that results from the two magnetic fields being pivoted in a cross-web and down-web directions as indicated by arrows in FIG. 7.

The method 600 can include positioning the first mixture 608 (indicated in "Apply Mixtures) on a substrate 612. The first mixture 608 can comprise the plurality of magnetizable particles 606 (see FIGS. 7A and 7B) dispersed in a first resin 607 (FIGS. 7A and 7B). The method 600 can include assembling the first plurality of magnetizable particles 606 into the desired structure 604A or 604B (again reference FIGS. 7A and 7B) for the control of the light by rotating modulation of a first magnetic field 618 relative to the plurality of magnetizable particles 606. The method 300 can further include vitrifying to increase a viscosity of the first resin (indicated as "Cure 1") while the plurality of magnetizable particles 606 are in the desired structure 604A or 604B.

FIGS. 7A and 7B shows the desired structures 604A and 604B that can result from the method 600. These desired structures result from orienting the first magnet 614 and a second magnet 620 both cross-web and down-web relative to the optical film 602. This orientation of the first and second magnets 614 and 620 changes the magnetic fields 618 and 622 as applied to the first plurality of magnetizable particles 606 and a second plurality of magnetizable particles 624.

The orientation of the first magnet 614 can be changed relative to the optical film 602 as indicated by arrows A1 about axis AA1 in FIG. 7. Similarly, the orientation of the second magnet 620 can be changed relative to the optical film 602 as indicated by arrow A2 about axis AA2. By orienting the first magnet 614 and/or the second magnet 620 as desired relative to one another and to the optical film, different overall desired structures can be obtained including the first desired structures 604A and 604B (via orientation/re-orientation of the first magnet 614). FIGS. 7A and 7B further show second desired structures 626A and 626B for the second plurality of magnetizable particles 624 that result from orientation/re-orientation of the second magnet 620. The second desired structures 626A combined with the first desired structures 604A provide the overall desired structures shown in FIG. 7A. The second desired structure 626B combined with the first desired structures 604B provide the overall desired structure shown in FIG. 7B. To reiterate, the overall desired structures of FIGS. 7A and 7B can differ do to the different orientation of the first magnet 614 and the second magnet 620.

It should be noted that FIGS. 7A and 7B provide just two examples of possible desired structures and further desired structures having different shapes due to the orientation of the first and second magnets relative to the optical film are also contemplated although not specifically shown. It should also be further noted that although FIGS. 7A and 7B appear to show the first desired structures 604A or 604B in a same layer as the second desired structures 626A or 626B, this is a result of the viewing orientation of FIGS. 7A and 7B, and that the first desired structures 604A or 604B would actually be positioned in a different layer of the optical film 602 than the second desired structures 626A or 626B.

The desired structure 604A or 604B allow the optical film 602 to be substantially light transmissive when viewed directly parallel to the z-axis. However, the desired structure 604A or 604B also limits light transmission at oblique angles to the optical film 602 (this is not limited to the y-z plane since structures are two-dimensional.

Because the method 600 of FIG. 7 forms the optical film 602 with multiple layers, the method 600 can include forming a second mixture 628 (indicated in "Apply Mixtures) that comprises the second plurality of magnetizable particles 624 (FIGS. 7A and 7B) dispersed in a second resin 630. The method 600 can position the second mixture 628 on one or more of the substrate, a second substrate or the first mixture. The method 600 can assemble the second plurality of magnetizable particles 624 into the second desired structure 626A or 626B for the control of the light further by rotating modulation of the second magnetic field 622 relative to the second plurality of magnetizable particles 624. The method can increase a viscosity of the second resin 630 (indicated as Cure 2) while the second plurality of magnetizable particles 624 are rows in the second desired structure 626A or 626B.

In some embodiments, the second mixture 628 and the first mixture 608 have one of a different composition or substantially a same composition. If the composition of the first mixture 608 and the second mixture 628 are substantially the same composition, the second mixture 628 can be positioned according to the method 700 of FIG. 8, after increasing the viscosity of the first resin 608 while the first plurality of magnetizable particles are in the first desired structure 604A or 604B.

Figure 8:
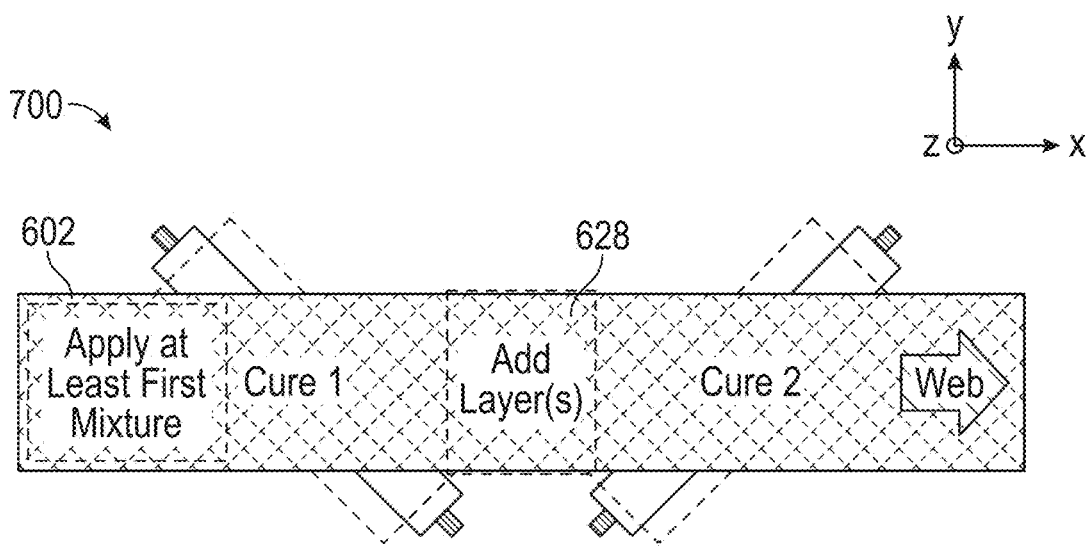
FIG. 8 is schematic view of a third method of forming the optical film using two magnetic fields and two cures where some of the plurality of magnetizable particles and a second resin are added after the first cure according to an example of the present disclosure.

FIG. 8 shows a further method 700 of forming the optical film 602 with at least two layers for control of light. The method 700 differs from the method 600 of FIG. 7 in that the second mixture 628 can be applied to the web at the labeled ("Add Layer(s)") after the Cure 1 such that the second resin 630 (FIGS. 7A and 7B) is not cured with the first resin 607 (FIGS. 7A and 7B).

Figure 9:
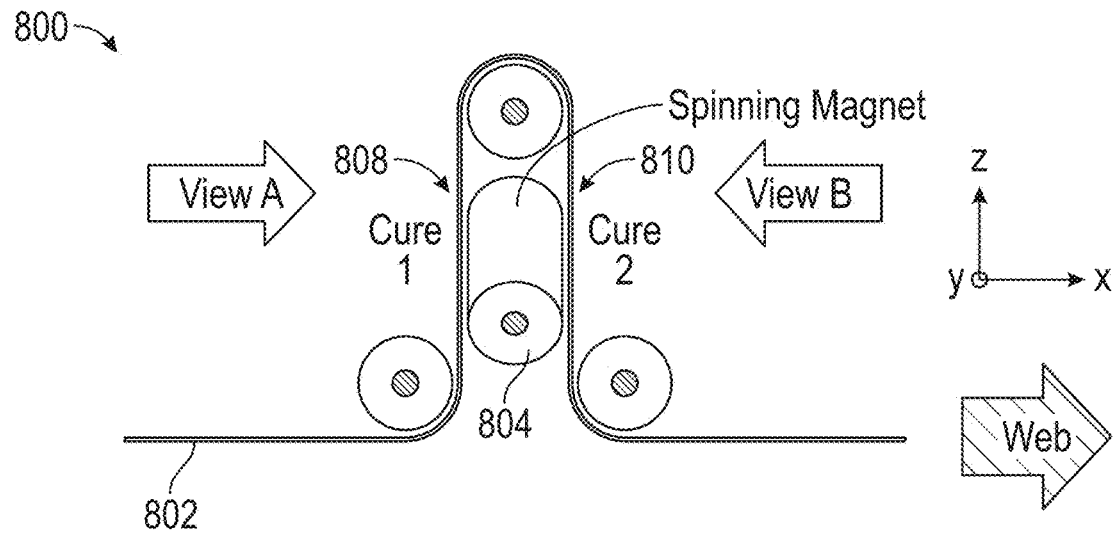
FIG. 9 is a schematic view of a fourth method of forming an optical film with a web path around a single magnet where the single magnet applies a magnetic field with two different orientations relative to the plurality of magnetizable particles and the web.
Figure 9A:
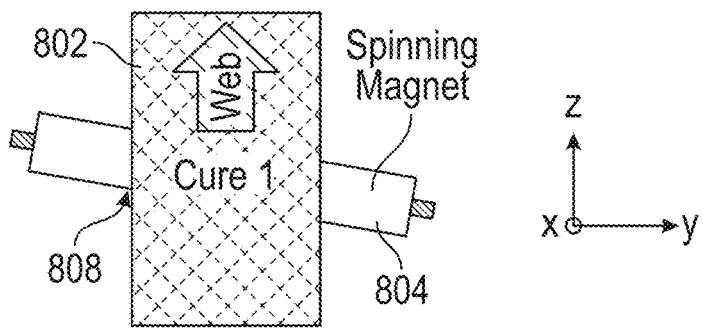
FIG. 9A is a schematic view taken from a first perspective in FIG. 9.
Figure 9B:
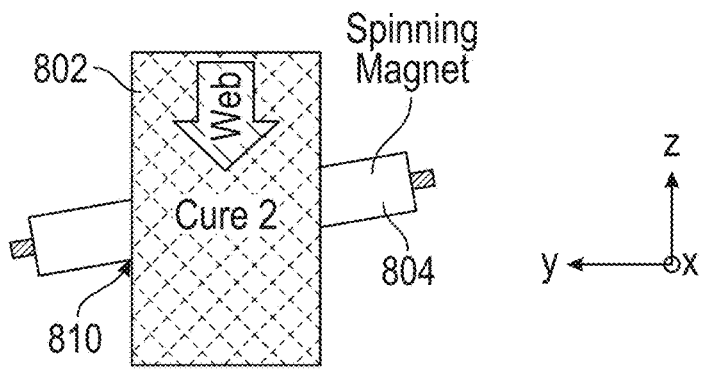
FIG. 9B is a schematic view taken from a second perspective in FIG. 9.

FIGS. 9, 9A and 9B show a method 800 of forming an optical film 802 having multiple layers that can be applied before Cure 1 or before Cure 1 and then again before Cure 2. The method 800 can provide for the first desired structures 604A or 604B and the second desired structures 626A or 626B, for example, as previously described due to the orientation of the magnet 804 relative to the optical film 802. The method 800 of FIGS. 9, 9A and 9B differs from FIGS.

Figure 9C:
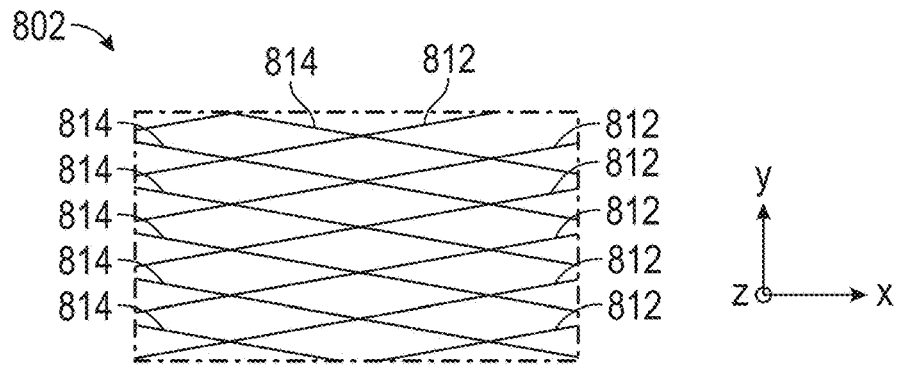
FIG. 9C is the third desired structure for the of magnetizable particles that results from the two magnetic fields with only the single magnet using the arrangement shown in FIG. 9.

7-8 in that a single magnet 804 can be utilized. The distance between the magnet axis of rotation and the web at Cure 1 may be different than that between the axis of rotation and the web at Cure 2. The single magnet 804 generates a first applied magnetic field 808 having rotating modulation on the optical film 802 in the region of Cure 1 as seen by view A of FIGS. 9 and 9A and produces a second applied magnetic field 810 having rotating modulation (that differs from the first applied magnetic field 808 due at least to orientation) in the region of Cure 2 as seen by view B of FIG. 9B. In this manner, the method 800 can use a single magnet to produce desired structures 812 and 814 such as those of FIG. 9C in multiple layers of the optical film 802.

Figure 10:
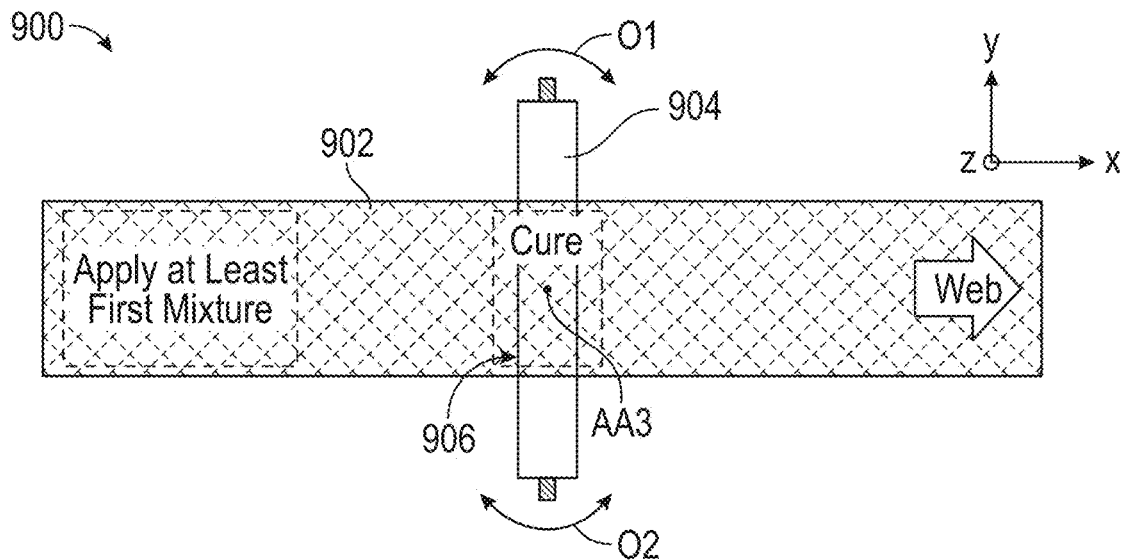
FIG. 10 is a schematic view of a fifth method of forming the optical film using one magnetic field that is dithered back and forth about a second axis while also undergoing rotating modulation according to an example of the present disclosure.

FIG. 10 show a method 900 of forming an optical film 902 that can be the same as the method 300 save that the magnet 904 can be moved in a dithering manner as indicated by arrows O1 and O2 back-and-forth about axis AA3. This dithering movement would be in addition to the rotation of the magnet 904 about the axis of rotation AR as previously described. Thus, a magnetic field 906 generated by the magnet 904 would have both rotating modulation and dithering relative to the optical film 902.

Figure 10A:
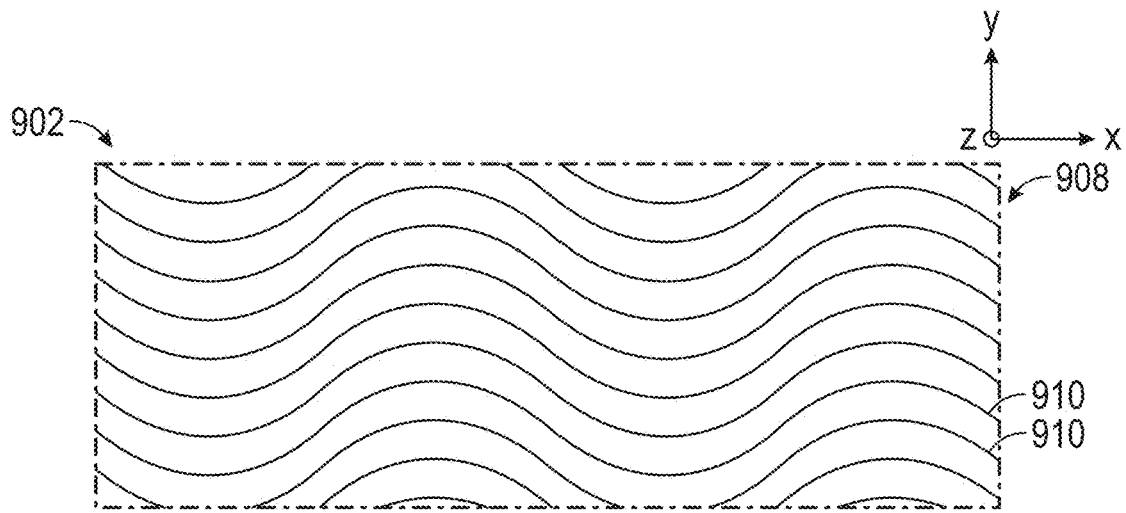
FIG. 10A is a fourth desired structure for the plurality of magnetizable that result from the dithering about the second axis and rotating modulation of the magnetic field of the embodiment of FIG. 10.

FIG. 10A shows a desired structure 908 for the plurality of magnetizable particles 910 in the optical film 902 that results from application of the magnetic field 906. The desired structure 908 has a sinusoidal pattern in a down-web direction due to the dithering movement of the magnetic field 906.

Figure 10B:
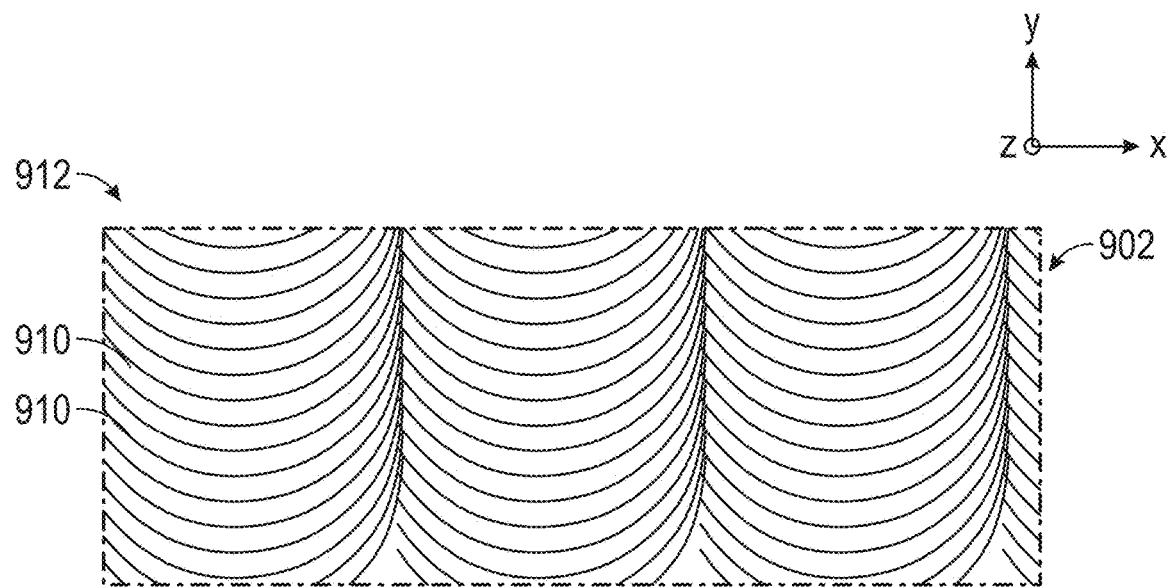
FIG. 10B is a fifth desired structure for the plurality of magnetizable that result from the full rotation about the second axis and rotating modulation of the magnetic field of the embodiment of FIG. 10.

FIG. 10B shows another desired structure 912 for the plurality of magnetizable particles 910 in the optical film 902 according to another embodiment, where rather than dithering back-and-forth in an arc of less than 360 degrees as shown in FIG. 10, the magnet 904 would be fully rotated 360 degrees continuously around the axis AA3 to produce the repeating ring like structures shown in FIG. 10B.

Figure 11:
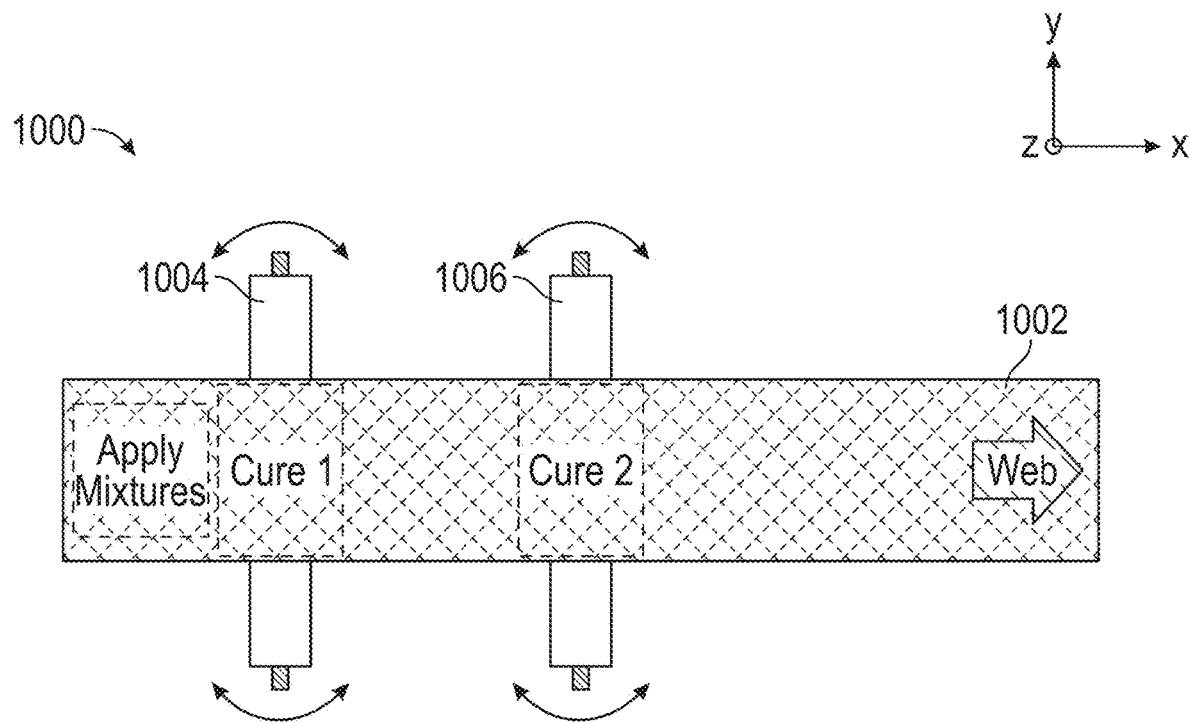
FIG. 11 is a schematic view of a sixth method of forming the optical film using at least two magnetic fields that are each dithering back and forth while each of the magnetic fields also undergoing rotating modulation according to an example of the present disclosure.
Figure 11A:
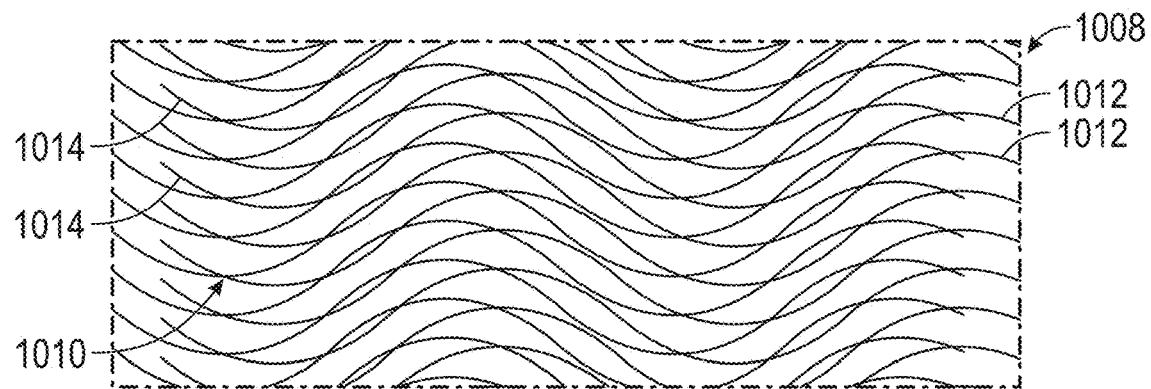
FIG. 11A is a sixth desired structure for the plurality of magnetizable particles that results from the dithering about the second axis and rotating modulation of the at least two magnetic fields of the embodiment of FIG. 11.

FIG. 11 show a method 1000 of forming an optical film 1002 that is identical to the method 900 of FIG. 10 save that the method utilizes a plurality of magnets 1004 and 1006 and the optical film 1002 has a plurality of layers. FIG. 11A shows the optical film 1002 with the desired structures 1008 and 1010 for two of the layers. The desired structure 1008 has a first plurality of magnetizable particles 1012. The desired structure 1010 has a second plurality of magnetizable particles 1014. The first plurality of magnetizable particles 1012 have an orientation that differs from that of the second plurality of magnetizable particles 1014.

Figure 12:
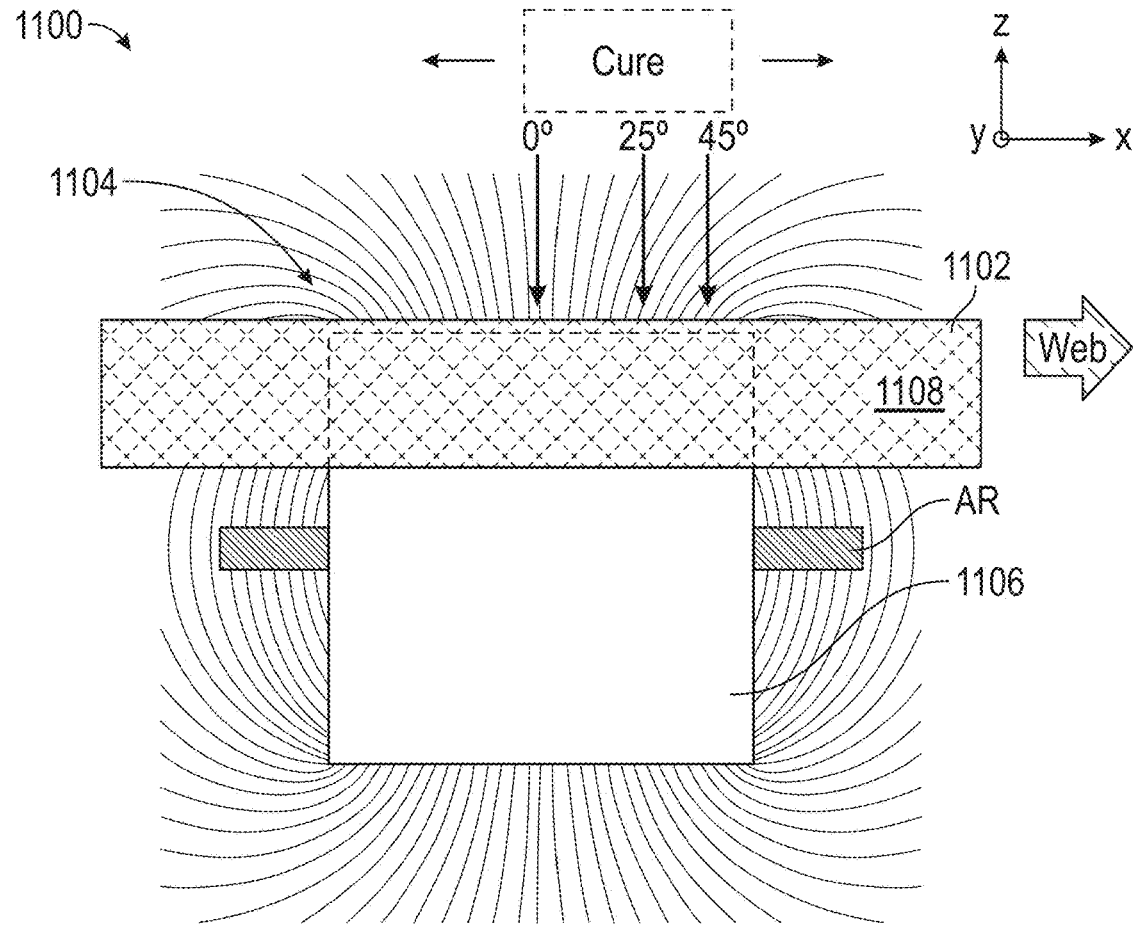
FIG. 12 is a schematic view of a seventh method of forming the optical film where a down-web position that the cure is applied can be changed relative to the magnetic field showing that different down-web distances experience a different orientation of the magnetic field according to an example of the present disclosure.

FIG. 12 shows a method 1100 of forming an optical film 1102 where the location of the at least partial cure can be shifted up-web or down-web due to a magnet 1106. This shift in the cure can be to a location where the lines of force from a magnetic field 1104 undergoing rotating modulation due to rotating of the magnet 1106 are at different angles relative to a major surface 1108 of the optical film 1102. It should be noted that in the embodiment of FIG. 12, the magnet 1106 has been reoriented relative to previously shown and described magnets. The magnet 1106 has an axis of rotation AR that generally extends up-web and down-web and is aligned with the x-direction of the Cartesian coordinate system (this system has been maintained throughout the FIGS.). Angles of the lines of force experienced by the optical film 1102 are indicated as measured from an angle substantially orthogonal to the major surface 1108 such that an angle of 0 degrees is substantially orthogonal to the major surface, an angle of 25 degrees is substantially 25 degrees from orthogonal and an angle of 45 degrees is substantially 45 degrees from orthogonal, etc.

Figure 12A:
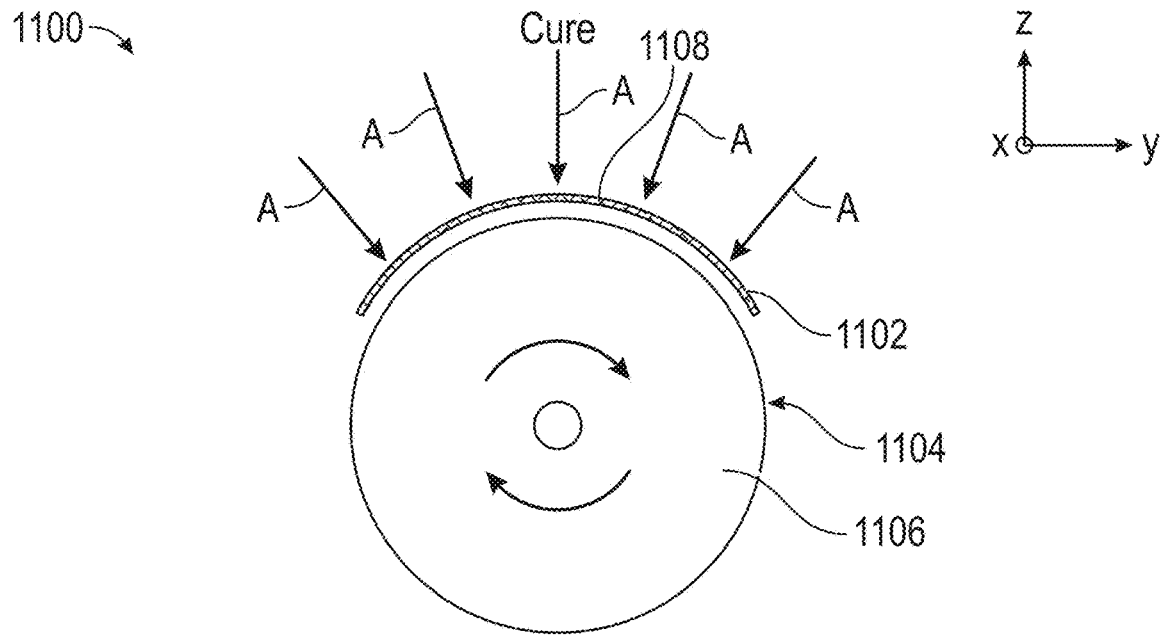
FIG. 12A is a schematic view of the method of FIG. 12 from another perspective showing the web can be curved about the magnet such that all cross-web locations of the same down-web location experience substantially the same orientation of the magnetic field according to an example of the present disclosure.

FIG. 12A shows the method 1100 of FIG. 12 but at an angle orthogonal to the view of FIG. 12. FIG. 12A further shows that the optical film 1102 can be curved or otherwise shaped in the cross-web direction by a roller, air currents, tenting, web tensioning or another technique. This shaping of the optical film 1102 in the cross-web direction can cause the major surface 1108 of the optical film 1102 to have a curvature that generally corresponds with and matches a curvature of the magnet 1106. This shaping of the optical film 1102 allows the major surface 1108 to experience substantially a same relative angle for the lines of force of the magnetic field 1104 in the cross-web direction as indicated by arrows A. Put another way, because of the curvature of the optical film 1102 substantially matching that of the curvature of the outer surface of the magnet 1106, each of the arrows A has substantially a same angle relative to the major surface 1108. Thus, the plurality of magnetizable particles experience substantially a same relative angle for the magnetic field 1104 even if they are located in different cross-web locations.

Figure 13:
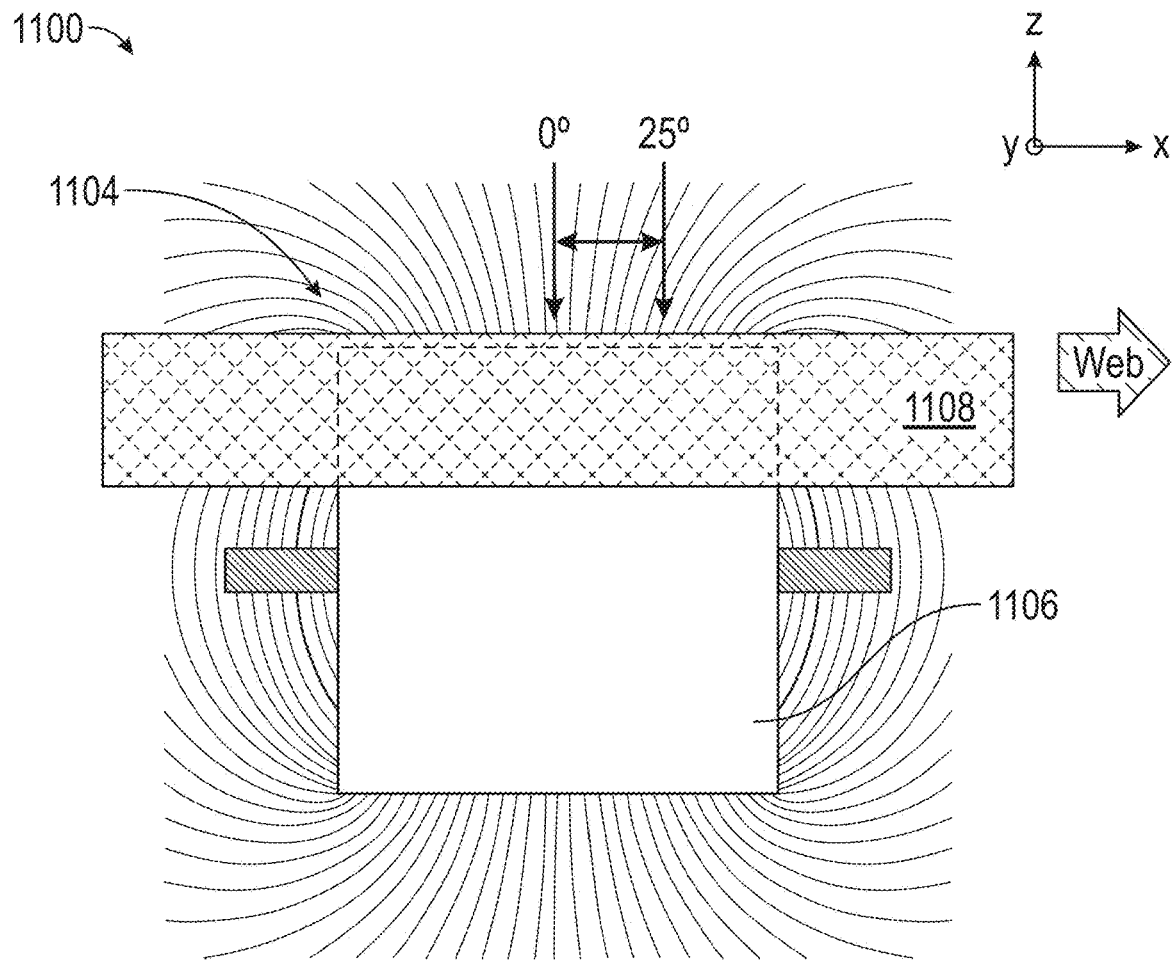
FIG. 13 is a schematic view of an eighth method of forming the optical film where a down-web position that the cure is applied is alternated between two locations (indicated as 0 degrees and 25 degrees) relative to the magnetic field according to an example of the present disclosure.

FIG. 13 shows an example utilizing the method 1100 previously described in FIG. 12 where the location of the cure in the down-web direction is altered relative to the magnet 1106 such that the lines of force from the magnetic field 1104 undergoing rotating modulation due to rotating of the magnet 1106 are at angles of substantially 0 degrees measured from orthogonal to the major surface 1108 and substantially 25 degrees measured from orthogonal to the major surface 1108.

Figure 13A:
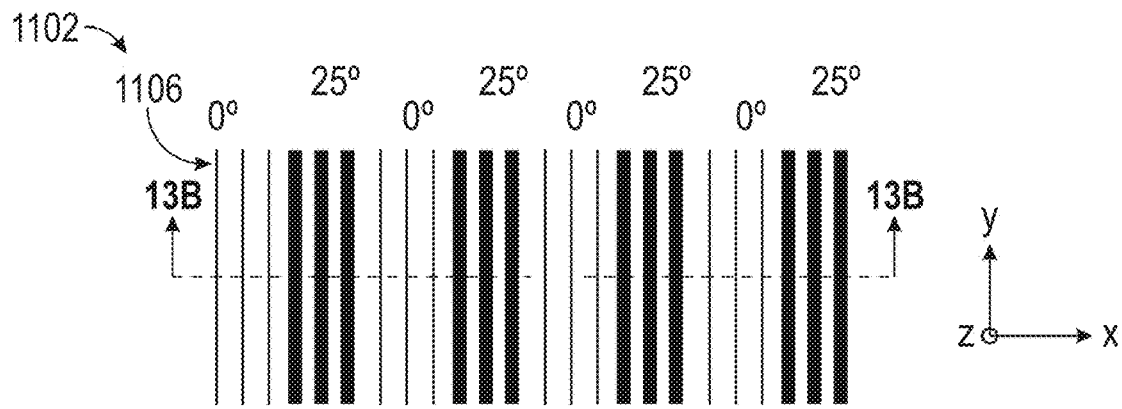
FIG. 13A is a seventh desired structure for the plurality of magnetizable particles that results from the two alternating cure locations of the method of FIG. 13.
Figure 13B:
FIG. 13B is a cross-sectional view of FIG. 13A along line at 13B-13B of FIG. 13.

FIG. 13A shows a desired structure 1110 that results for the optical film 1102 from the method of FIG. 13. FIG. 13B shows the desired structure 1110 in cross-section along line 13B-13B of FIG. 13A.

Figure 14:
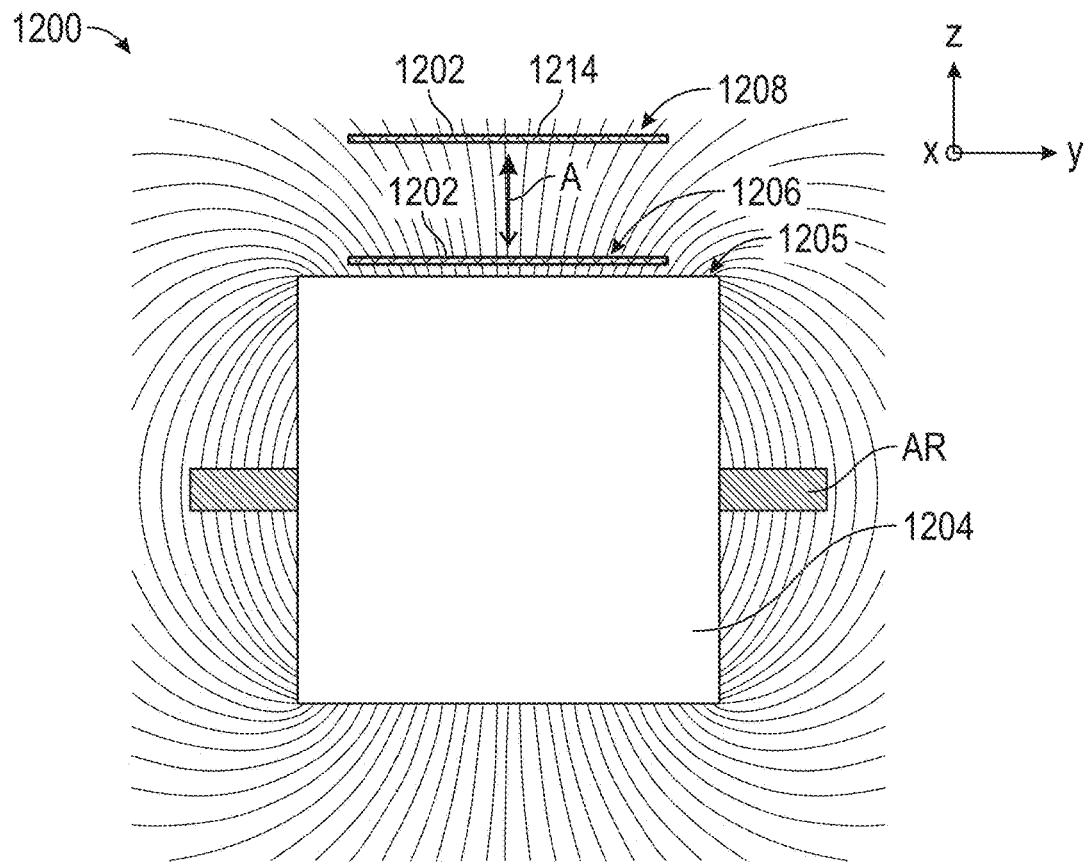
FIG. 14 is a schematic view of a ninth method of forming the optical film where a position of the entire web relative to the surface of the magnet is changed such that the relative orientation of the magnetic field is changed relative to the plurality of magnetizable particles according to an example of the present disclosure.

FIG. 14 shows a method 1200 where the relative position of an optical film 1202 is changed (as indicated by arrow A) relative to a magnet 1204 having a magnetic field 1205. More specifically, the optical film 1202 can be moved between a relatively closer position 1206 and a relatively further position 1208 from the magnet 1204 and the magnetic field 1205 such that a distance between a major surface 1214 of the optical film 1202 and the axis of rotation AR of the magnet 1204 is changed. The tracks of the plurality of magnetizable particles tend to be more closely spaced when the optical film 1202 is in the relatively closer position 1206 and the tracks of the plurality of magnetizable particles tend to be more widely spaced when the optical film 1202 is in the relatively further position 1208. It should be noted with FIGS. 14 and 15 (discussed subsequently) that the magnet 1204, 1304 is oriented substantially cross-web such as previously shown in FIG. 3, and therefore, is not oriented in the manner of FIGS. 12-13. However, it should be noted that in other embodiments, the magnet 1204, 1304 could be oriented relative to the optical film 1202, 1302 as shown in FIGS. 12-13 and the method 1200, 1300 utilized to obtain different desired structures than are shown in FIGS. 14A, 14B and 15A.

Figure 14A:
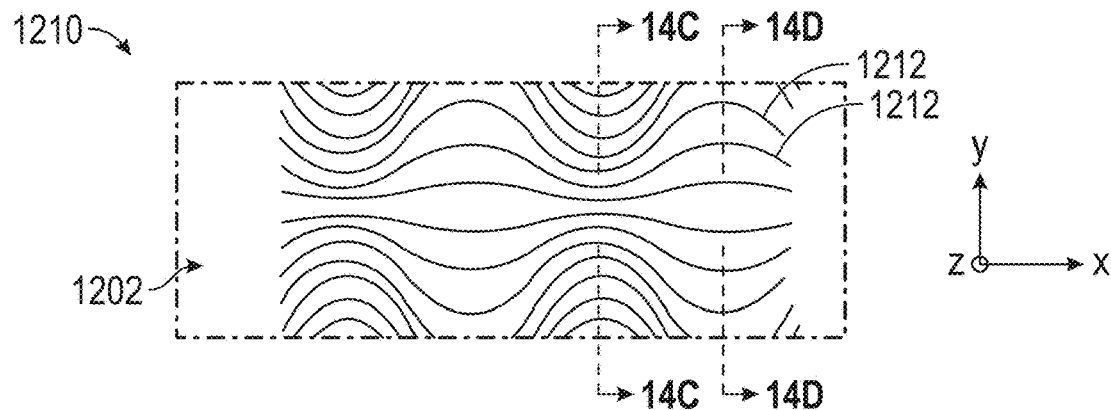
FIGS. 14A and 14B are the eighth and ninth desired structures for the plurality of magnetizable particles that result from combining the method of FIG. 14 with the method of FIG. 3 and combining the method of FIG. 14 with the method of FIG. 12.
Figure 14B:
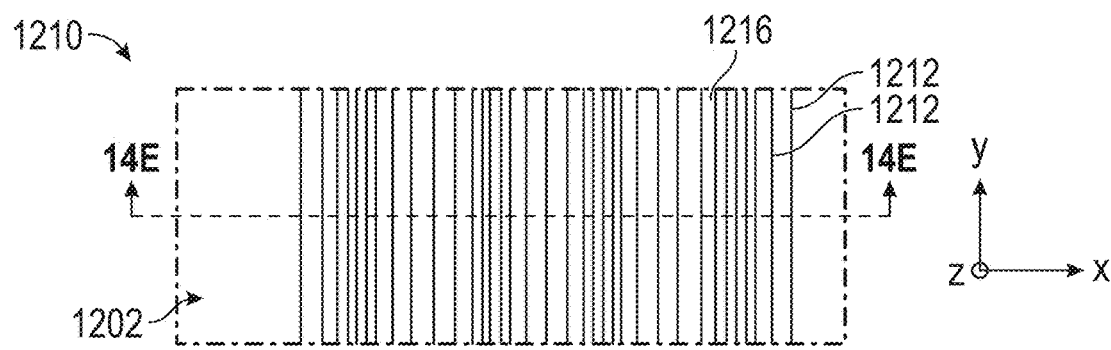
Figure 14C:
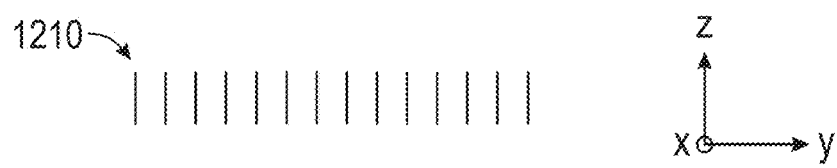
FIG. 14C is a cross-sectional view of FIG. 14A along line 14C-14C of FIG. 14A.
Figure 14D:
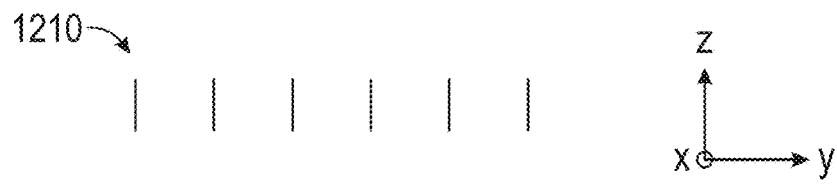
FIG. 14D is a cross-sectional view of FIG. 14A along line 14D-14D of FIG. 14A.
Figure 14E:
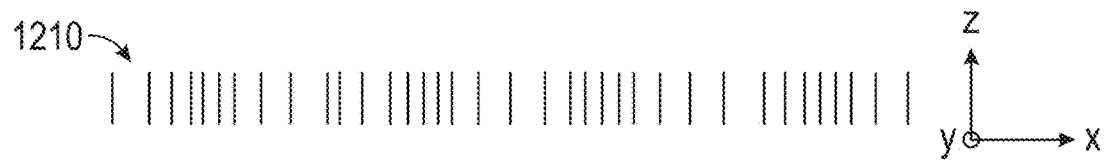
FIG. 14E is a cross-sectional view of FIG. 14B along line 14E-14E of FIG. 14B.

FIGS. 14A and 14B show a desired structure 1210 for the plurality of magnetizable particles 1212. FIGS. 14C-14E show the desired structure 1210 from various cross-sections of FIGS. 14A and 14B. FIG. 14A an undulating track of the plurality of magnetizable particles 1212 in the down-web (x-direction) formed by combining the method of FIG. 14 and the method of FIG. 3, where the method of FIG. 3 tends to from down-web tracks and the method of FIG. 14 tends to vary the spacing of these tracks. FIG. 14B is formed by combining the method of FIG. 14 and the method of FIG. 12, where the method of FIG. 12 tends to from cross-web tracks and the method of FIG. 14 tends to vary the spacing of these tracks.

Figure 15:
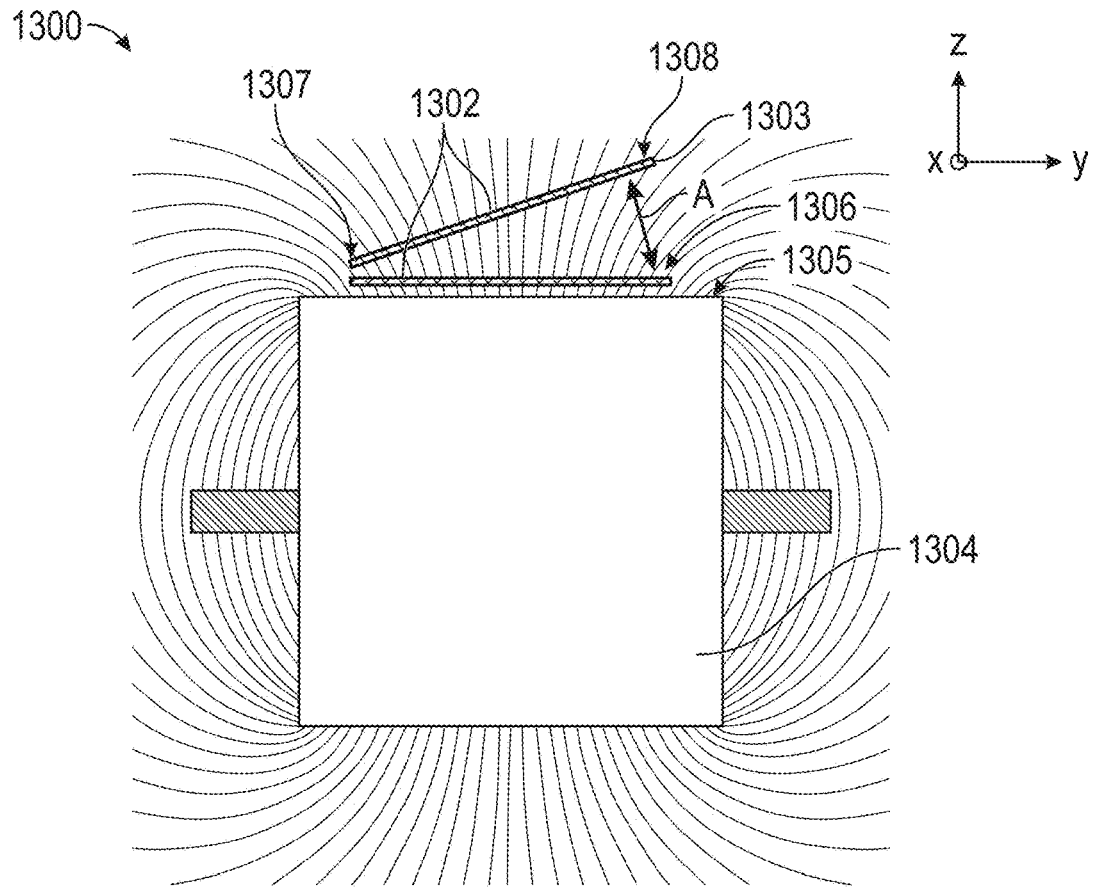
FIG. 15 is a schematic view of a tenth method of forming the optical film where the angle of the web relative to the magnetic field is changed according to an example of the present disclosure.

FIG. 15 shows a method 1300 where the relative position of only a first portion 1303 of an optical film 1302 is changed (as indicated by arrow A) relative to a magnet 1304 having a magnetic field 1305. More specifically, the first portion 1303 of the optical film 1302 can be moved (e.g., tilted) between a relatively closer position 1306 and a relatively further position 1308 from the magnet 1304 and the magnetic field 1305. A second end 1307 of the optical film 1302 can remain in substantially a same position or only a slightly altered position relative to the magnet 1304 and the magnetic field 1305.

Figure 15A:
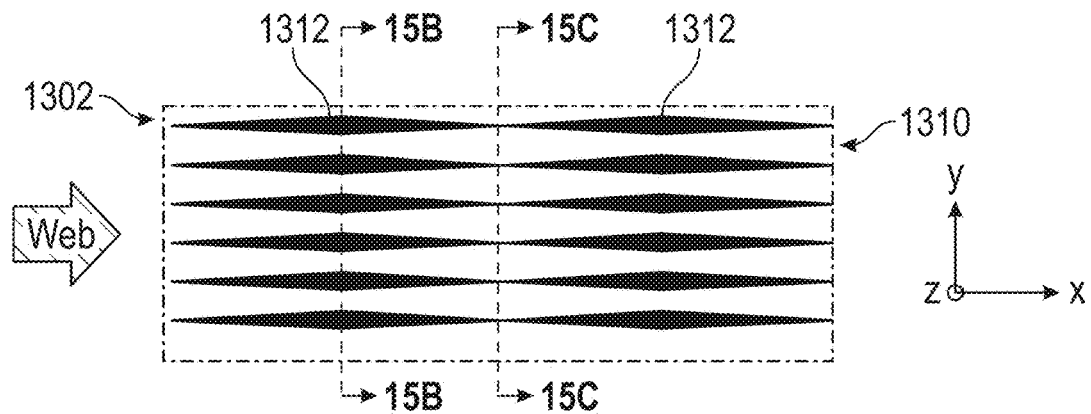
FIG. 15A is a ninth desired structure for the plurality of magnetizable particles that results from the change of the portion of the web relative to the magnetic field of the method of FIG. 15.
Figure 15B:
FIG. 15B is a cross-sectional view of FIG. 15A along line 15B-15B of FIG. 15B.
Figure 15C:
FIG. 15C is a cross-sectional view of FIG. 15A through line 15C-15C.
Figure 15C:
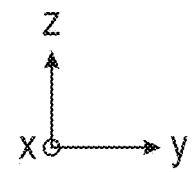

FIG. 15A shows a desired structure 1310 that results from the back and forth change in position of the first portion 1303 of the optical film 1302 from the position of 1306 and the position of 1308. FIGS. 15B and 15C are cross-sections of the desired structure 1310 from FIG. 15A. As shown in FIG. 15A, the change to position 1308 and back to position 1306 results in the regions 1312 where the plurality of magnetizable particles are tilted cross-web.

Figure 16:
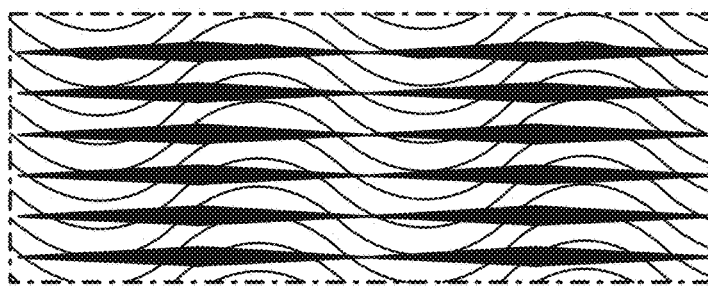
FIG. 16 shows further desired structures for the plurality of magnetizable particles in optical films having multiple layers that can be obtained by using multiple magnetic fields by combining at least the methods of FIGS. 10-15, for example.
Figure 16:
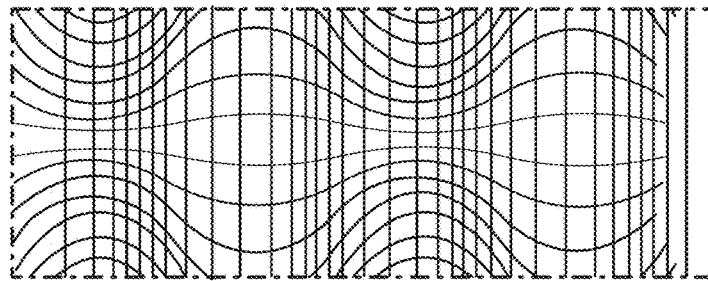
Figure 16:
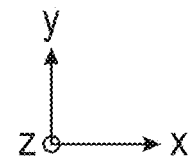
Figure 16:
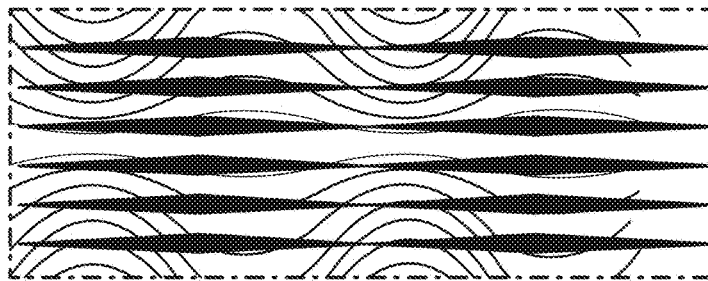

FIG. 16 shows examples where various of the methods 900-1300 are combined to form multi-layer optical films 1402, 1404 and 1406. Indeed, it should be noted that any of the methods disclosed herein can be combined or modified such as to form multi-layer optical films have a plurality of magnetizable particles organized in various desired structures for the control of light.

Figure 17:
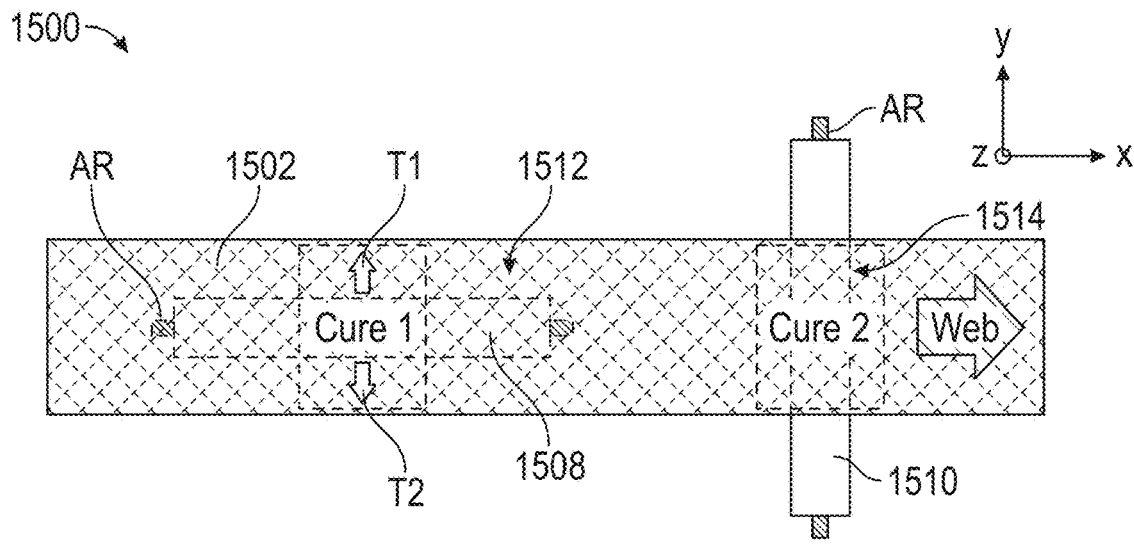
FIG. 17 is a schematic view of an eleventh method of forming the optical film where a first magnetic field is translated in a cross-web direction relative to the web while undergoing rotating modulation and a second magnetic field is oriented substantially transverse to the first magnetic fields and undergoes rotating modulation according to an example of the present disclosure.
Figure 17A:
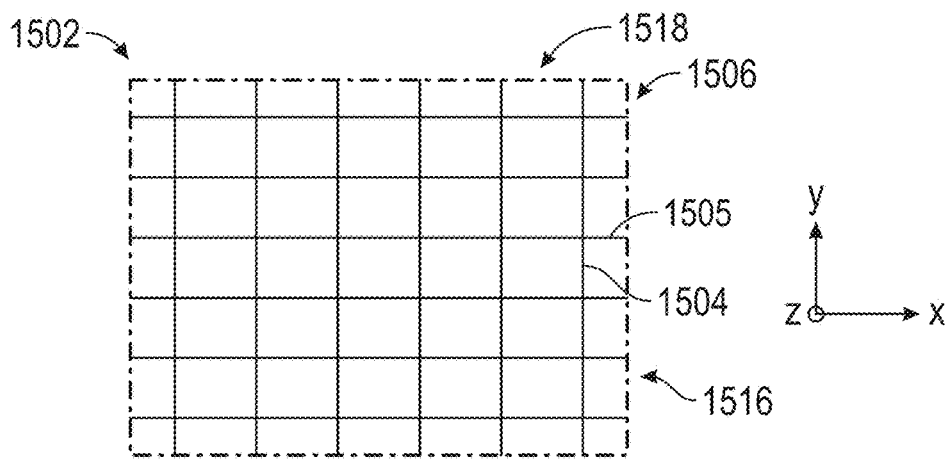
FIG. 17A is a tenth desired structure for the plurality of magnetizable particles as a result of the two magnetic fields of the embodiment of FIG. 17.

FIG. 17 is a method 1500 according to another embodiment for making an optical film 1502 that has a first and a second plurality of magnetizable particles 1504, 1505 organized in an overall desired structure 1506 as shown in FIG. 17A. The method 1500 can utilized at least two magnets 1508 and 1510. The first magnet 1508 can rotate about an axis of rotation AR and can have a first magnetic field 1512 with rotating modulation. The second magnet 1510 can rotate about an axis of rotation AR and can have a second magnetic field 1514 with rotating modulation. Additionally, the first magnet 1508 can translate back-and-forth in the cross-web (y-axis) direction as indicated by arrows T1 and T2.

FIG. 17A shows the overall desired structure 1506 for the multi-layer optical film 1502 that results from the method 1500 with the first plurality of magnetizable particles 1504 positioned, oriented and/or aligned by the first magnetic field 1512 into a first desired structure 1516 and the second plurality of magnetizable particles 1505 positioned, oriented and/or aligned by the second magnetic field 1514 into a second desired structure 1518. As shown in FIG. 17A, the rows of the first plurality of magnetizable particles 1504 of the first desired structure 1516 are oriented transverse to the rows of the second plurality of magnetizable particles 1505 of the second desired structure 1518.

Figure 18:
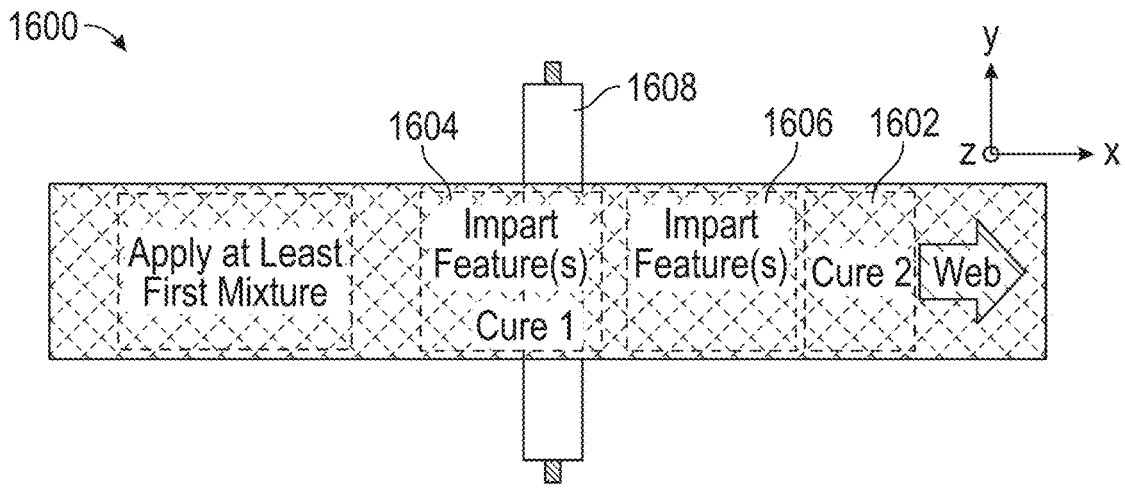
FIG. 18 is a schematic view of a twelfth method of forming the optical film where one or more features are imparted in the optical film prior to, during or after application of the magnetic field and/or cure according to an example of the present disclosure.

FIG. 18 shows a method 1600 where features 1604 and/or 1606 can be imparted to an optical film 1602 before, during or after at least a partial cure of the at least a first mixture containing an optically clear resin and a plurality of magnetizable particles. FIG. 18 shows the method 1600 performing a first partial cure ("Cure 1") adjacent a first magnet 1608 and applying a second full cure ("Cure 2") down-web from the first magnet 1608. The features that can be imparted to the optical film 1602 or can be fabricated prior so as to be inherent in the initial web of the optical film 1602 prior to application of the method 1600. The features can include, but are not limited to, temporarily curving the optical film 1602 in a cross-web direction (previously shown in FIGS. 12 and 12A), curving/distorting the optical film 1602 in the up-web/down-web direction, imparting further, magnetizable particles, substrates, and/or layers to the optical film (previously described), adding texture to the substrate (shown in FIG. 19), adding a texture to the layer containing the plurality of magnetizable particles (shown in FIG. 20), using a profiled die or another tool to impart thickness variation into the mixture/layer, providing for a discontinuous layer containing the plurality of magnetizable particles, providing for localized irregularities in the magnetic field, providing for flux concentrations in the magnetic field, increasing or decreasing the field strength (the magnetic force) applied by the magnet, and/or providing the substrate with a variable thickness.

FIG. 19 shows the method 1600 where features are imparted to the substrate by an apparatus 1610 prior to, during, or after the at least partial cure ("Cure 1" of FIG. 18). These features can comprise texturing of the substrate either cross-web, down-web or both such that the position and angle of the substrate of the substrate relative to the axis of rotation of the magnet can vary from one region (region 1612) to another region. This texturing of the substrate can alter the layer 1614 containing the plurality of magnetizable particles such that the plurality of magnetizable particles in one region can have a different positioning, orientation or alignment relative to those in other regions. FIG. 20 shows the method 1600 where features are imparted directly to the layer 1614 by the apparatus 1610 rather than the substrate. Texturing the layer 1614 can vary the thickness of the layer 1614 containing the plurality of magnetizable particles either cross-web, down-web or both such that the plurality of magnetizable particles in one region can have a different positioning, orientation or alignment relative to those in other regions.

FIG. 21 shows a magnet 1702 that is a composite assembly to form localized irregularities in its magnetic field 1704. More particularly, the magnet 1702 has a first portion 1706 with a first magnetic field 1708 and a second portion 1710 with a second magnetic field 1712. The first portion 1702 is rotated about axis A slightly such that the pole N of the first portion 1706 does not align directly with the pole N of the second portion 1710. Thus, the first magnetic field 1708 differs in orientation from the second magnetic field 1712, such shift in orientation is called a localized irregularity in the present disclosure.

FIG. 22 shows a magnet 1802 with a magnetic field 1804 having flux concentrations 1806 due to projections 1808 along the surface of the magnet 1802. Such projections can be part of the magnet 1802 or can be ferrous pieces that are separate from the magnet 1802. Further information regarding flux concentrations can be found in PCT Publication No. WO 2018/136269, the entire disclosure of which is incorporated herein by reference in its entirety.

Figure 23:
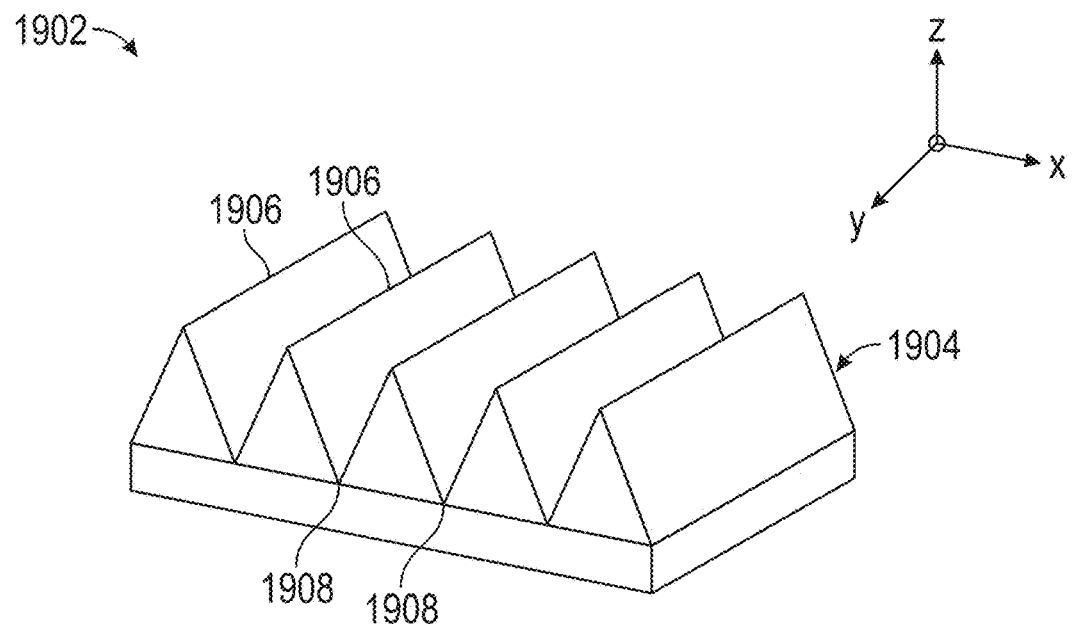
FIGS. 23 and 23A show an embodiment where the substrate of the optical film is varied in thickness in a predetermined manner, the variable thickness is designed to capture and orient the plurality of magnetizable particles as shown in FIG. 23A according to an example of the present application.
Figure 23A:
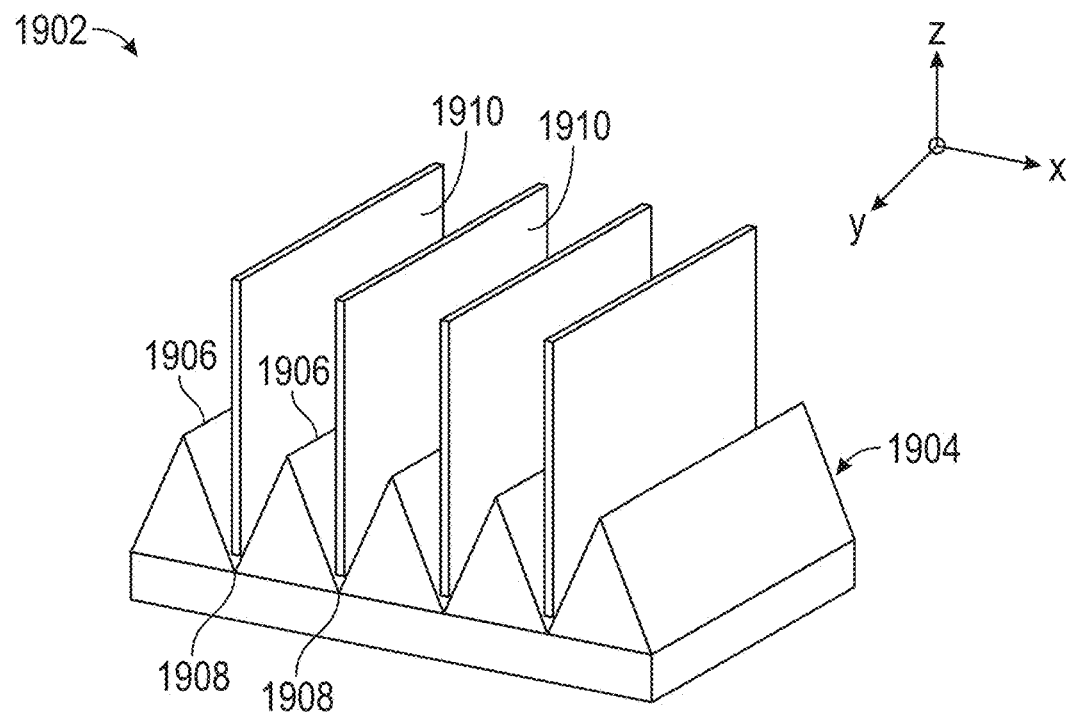

FIGS. 23 and 23A show an optical film 1902 with a substrate 1904 fabricated with a variable thickness. The substrate 1904 can have alternating peaks 1906 and valleys 1908. The valleys 1908 can be configured to receive a plurality of magnetizable particles 1910 therein as shown in FIG. 23A. The optically clear resin is not shown in FIG. 23A. The peaks 1908 can be configured to assist the plurality of magnetizable particles 1910 to achieve a desired orientation by guiding the plurality of magnetizable particles 1910 into the orientation shown in FIG. 23A and by supporting the plurality of magnetizable particles 1910 along the sides thereof. The valleys 1908 can be configured to assist the plurality of magnetizable particles 1910 to be positioned with the desired orientation as well as relative spacing as shown in FIG. 23A.

The following embodiments are intended to be illustrative of the present disclosure and not limiting.

Various Notes & Examples

Example 1 is a method of making an optical film for control of light that can optionally comprising: positioning a first mixture on a substrate, wherein the first mixture comprises a first plurality of magnetizable particles dispersed in a first resin, assembling the first plurality of to magnetizable particles into a desired structure for the control of the light by rotating modulation of at least a first magnetic field relative to the first plurality of magnetizable particles, and vitrifying the first resin while the first plurality of magnetizable particles are in the desired structure.

Example 2 is the method of Example 1, wherein vitrifying the first resin can comprise at least partially polymerizing the first resin.

Example 3 is the method of any one or combination of Examples 1-2, and can optionally further comprise: forming a second mixture that comprises a second plurality of magnetizable particles dispersed in a second resin, positioning the second mixture on one or more of the substrate, a second substrate or the first mixture, assembling the second plurality of magnetizable particles into a second desired structure for the control of the light further by rotating modulation of at least a second magnetic field relative to the second plurality of magnetizable particles, and vitrifying the second resin while the second plurality of magnetizable particles are in the second desired structure.

Example 4 is the method of Example 3, wherein the second mixture and the first mixture can have one of a different composition or substantially a same composition, and if the substantially the same composition, the second mixture can be positioned after increasing the viscosity of the first resin while the first plurality of magnetizable particles are in the desired structure.

Example 5 is the method of any one or any combination of Examples 3-4, wherein the first plurality of magnetizable particles can have at least one of a shared first orientation or first common alignment direction relative to the substrate and the second plurality of particles can have at least one of a shared second orientation or second common alignment direction relative to the substrate, and wherein the shared first orientation or first common alignment direction can differ from the shared second orientation or second common alignment direction.

Example 6 is the method of any one or any combination of Examples 3-5, wherein rotating modulation of at least the first magnetic field relative to the first plurality of magnetizable particles and rotating modulation of at least the second magnetic field relative to the second plurality of magnetizable particles can be from a single magnet.

Example 7 is the method of any one or any combination of Examples 1-6, and can optionally further comprising varying the first magnetic field relative to the first plurality of magnetizable particles by one or more of: moving the first plurality of magnetizable particles relative to the first magnetic field in one or more directions, moving the first magnetic field relative to the first plurality of magnetizable particles in at least a second direction, varying a strength of the first magnetic field, and providing for at least one of localized irregularities or flux concentrations in the first magnetic field.

Example 8 is the method of Example 7, wherein moving the first plurality of magnetizable particles relative to the first magnetic field can include one or more of applying a texture to one or more of the first mixture and the substrate to provide the one or more of the first mixture and the substrate with a variable thickness, curving the substrate and first mixture in one or more of a down-web and cross-web direction, distorting the substrate and first mixture, and depositing the first mixture on the substrate with the substrate having a variable thickness.

Example 9 is the method of any one or any combination of Examples 7 and 8, wherein moving the first magnetic field relative to the first plurality of magnetizable particles in at least the second direction can include one or more of translating the first magnetic field one or more of cross-web and down-web in a plane orthogonal to an axis of rotation of the first magnetic field and dithering the first magnetic field one or more of cross-web and down-web in a plane orthogonal to the axis of rotation of the first magnetic field.

Example 10 is a method of making an optical film for control of light that can optionally comprise: providing a substrate, a first mixture including a first plurality of magnetizable particles dispersed in a first resin and a second mixture including a second plurality of magnetizable particles dispersed in a second resin, assembling the first plurality of magnetizable particles into a first desired structure for the control of the light by rotating modulation of at least a first magnetic field relative to the first plurality of magnetizable particles, vitrifying the first resin with the first plurality of magnetizable particles assembled in the first desired structure, assembling the second plurality of magnetizable particles into a second desired structure for the control of the light by rotating modulation of at least a second magnetic field relative to the second plurality of magnetizable particles, and vitrifying the second resin with the second plurality of magnetizable particles assembled in the second desired structure.

Example 11 is the method of Example 10, wherein the first resin and the second resin can have a different composition are vitrified using a different vitrification technique.

Example 12 is the method of Example 11, wherein the different vitrification technique comprises UV vitrification with the vitrifying the first resin at a first wavelength and the vitrifying the second resin at a second wavelength.

Example 13 is the method of any one or any combination of Examples 10-12, and optionally further comprising varying at least the first magnetic field relative to the first plurality of magnetizable particles by one or more of: moving the first plurality of magnetizable particles relative to the first magnetic field in one or more directions, moving the first magnetic field relative to the first plurality of magnetizable particles in at least a second direction, varying a strength of the first magnetic field, and providing for at least one of localized irregularities and flux concentrations in the first magnetic field.

Example 14 is the method of Example 13, wherein moving the first plurality of magnetizable particles relative to the first magnetic field can include one or more of applying a texture to one or more of the first mixture and the substrate to provide the one or more of the first mixture and the substrate with a variable thickness, curving the substrate and first mixture in one or more of a down-web and cross-web direction, distorting the substrate and first mixture, and depositing the first mixture on the substrate with the substrate having a variable thickness.

Example 15 is the method of any one or any combination of Examples 12 and 13, wherein moving the first magnetic field relative to the first plurality of magnetizable particles in at least the second direction can include one or more of translating the first magnetic field one or more of cross-web and down-web in a plane orthogonal to an axis of rotation of the first magnetic field and dithering the first magnetic field one or more of cross-web and down-web in a plane orthogonal to the axis of rotation of the first magnetic field.

Example 16 is a method of making an optical film for control of light that can optionally comprise: positioning a first magnet relative to a web containing at least a first mixture of a first plurality of magnetizable particles dispersed in a first resin, rotating the first magnet about an axis such that a north pole and a south pole of the first magnet alternatively pass in proximity of the web, passing the web adjacent the first magnet such that the first plurality of magnetizable particles are influenced by a magnetic field of the first magnet and form a desired structure as affected by the first magnetic field, wherein the desired structure is configured to control the light, and vitrifying the first resin to capture the first plurality of magnetizable particles in the desired structure.

Example 17 is the method of Example 16, and optionally further comprising: positioning a second magnet relative to the web, wherein the web has at least a second mixture of a second plurality of magnetizable particles dispersed in a second resin deposited thereon, and rotating the second magnet about an axis such that a north pole and a south pole of the second magnet alternatively pass in proximity of the web, passing the web adjacent the second magnet such that the second plurality of magnetizable particles are influenced by a magnetic field of the second magnet and form a second desired structure as affected by the second magnetic field, wherein the second desired structure is configured to control the light; and vitrifying the second resin to capture the second plurality of magnetizable particles in the desired structure.

Example 18 is the method of any one or combination of Examples 16-17, and optionally further comprising varying at least the first magnetic field relative to the first plurality of magnetizable particles by one or more of: moving the first plurality of magnetizable particles relative to the first magnetic field in one or more directions, moving the first magnetic field relative to the first plurality of magnetizable particles in at least a second direction, varying a strength of the first magnetic field, and providing for at least one of localized irregularities and flux concentrations in the first magnetic field.

Example 19 is the method of Example 18, wherein moving the first plurality of magnetizable particles relative to the first magnetic field can include one or more of applying a texture to one or more of the first mixture and the substrate to provide the one or more of the first mixture and the substrate with a variable thickness, curving the substrate and first mixture in one or more of a down-web and cross-web direction, distorting the substrate and first mixture, and depositing the first mixture on the substrate with the substrate having a variable thickness.

Example 20 is the method of any one or any combination of Examples 18 and 19, wherein moving the first magnetic field relative to the first plurality of magnetizable particles in at least the second direction can include one or more of translating the first magnetic field one or more of cross-web and down-web in a plane orthogonal to an axis of rotation of the first magnetic field and dithering the first magnetic field one or more of cross-web and down-web in a plane orthogonal to the axis of rotation of the first magnetic field.

Working Examples

Unless otherwise noted, all parts, percentages, ratios, etc. in the Examples and the rest of the specification are by weight.

Material abbreviations used in the Examples are described in Table 1, below.

TABLE 1

| ABBREVIATION | DESCRIPTION |
| --- | --- |
| RES | UV curable resin formulated from the components listed in Table 2 |
| MAGP | 98% pure synthetic iron oxide magnetite powder, obtained as PIROX-100 from Pirox LLC, New Brighton, PA |
| GLAS | Glass slides 50 mm × 75 mm × 1 mm thick, obtained from VWR (catalogue no. 48382-179). |
| UVLED | A UV light source of 4 × 4 LED chips with a wavelength of 365 nm and a maximum input current of 1.4 Amperes. The chips are produced by Nichia Corporation (Tokyo, Japan), with a part number NVSU233B(T) |
| SEN | Fe/Al/Si magnetizable alloy particles, obtained as SENDUST SP-3B from Mate Co., Ltd., Okayama Prefecture, Japan |

TABLE 2

| Component | Description | Supplier | Wt. Fraction |
| --- | --- | --- | --- |
| Photomer 6010 | aliphatic urethane diacrylate | IGM Resins USA Inc. (Charlotte, NC) | 0.39 |
| SR 454 | trimethylpropane triacrylate with about three moles of ethoxylation | Sartomer (Extom, PA) | 0.35 |
| SR 602 | bisphenol A diacrylate with about four moles of ethoxylation | Sartomer (Extom, PA) | 0.13 |
| SR 339 | 2-phenoxyethyl acrylate (PEA) | Sartomer (Extom, PA) | 0.05 |
| SR 351 | trimethylolpropane triacrylate (TMPTA) | Sartomer (Extom, PA) | 0.05 |
| SR 601 | bisphenol A diacrylate with about ten moles of ethoxylation | Sartomer (Extom, PA) | 0.03 |
| Darocur TPO | photoinitiator | Ciba Specialty Chemicals | trace (<0.01) |
| Darocur 1173 | photoinitiator | Ciba Specialty Chemicals | trace (<0.01) |

Assembly of Magnetic Apparatus MAGI 6 diametrically magnetized cylinder magnets of dimensions 50.8 mm outer diameter by 50.8 mm width by 6.35 mm inner diameter (obtained as RY04Y0DIA from K&J Magnetic Inc., Plumsteadville, Pa.) were affixed to a 6.22 mm 304 stainless steel shaft with epoxy (obtained as EPOXY ADHESIVE DP460 from 3M Company, St. Paul, Minn.) with all north poles facing the same direction; essentially creating a single diametrically magnetized cylinder magnet with dimensions 50.8 mm diameter by 304.8 mm. This resultant cylinder magnet MAGI was connected to an electric DC motor (obtained as LEESON 108020.00 1HP DC motor from W. W. Grainger, Lake Forest, Ill.) to spin it about its axis.

The following two solutions were used for the experiments listed here.

Preparation of MIX1

98 grams of RES was mixed with 2 grams of SEN by hand for 30 seconds. The resultant MIX1 contained 2% SEN particles by weight.

Preparation of MIX2

98 grams of RES was mixed with 2 grams of MAGP by hand for 30 seconds. The resultant MIX2 contained 2% MAGP particles by weight Working Example 1

Figure 24A:
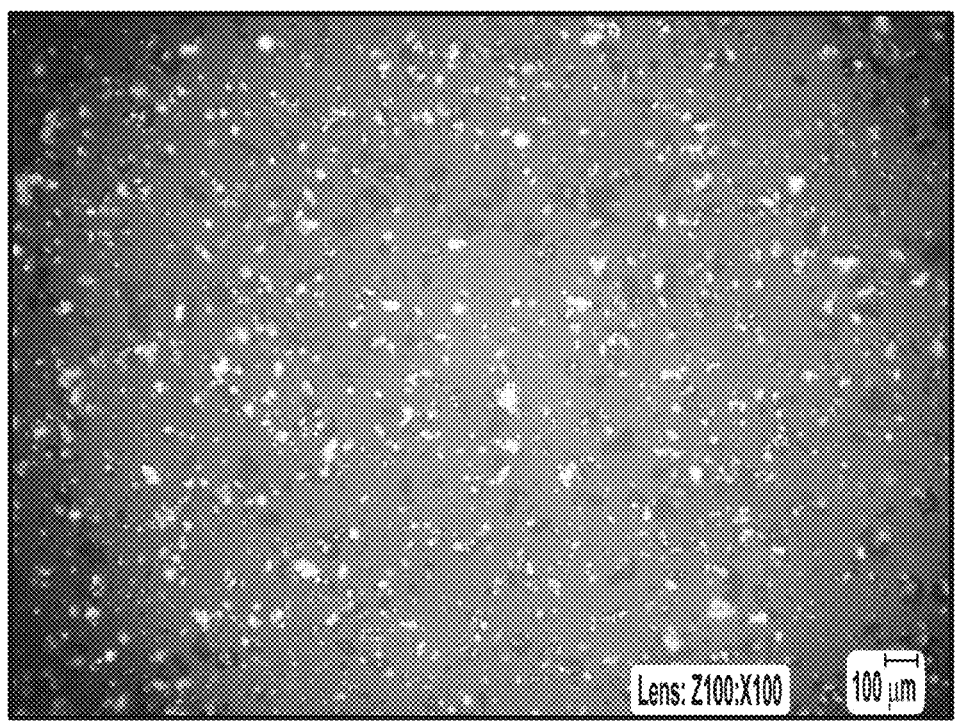
FIG. 24A is an image of a plurality of magnetizable particles without arrangement due to the absence of application of a magnetic field on a substrate as is further described in the working examples.
Figure 24B:
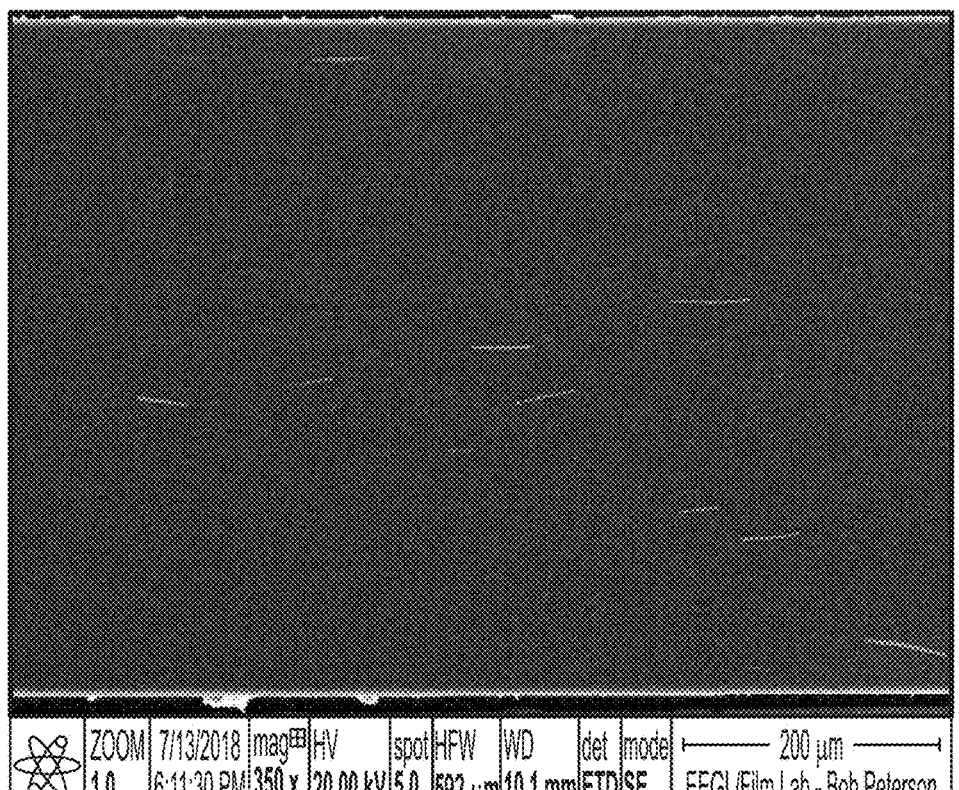
FIG. 24B is a cross-sectional SEM image of a plurality of magnetizable particles without arrangement due to the absence of application of a magnetic field on a substrate as further described in the working examples.

A 0.5 mL droplet of MIX1 was placed on a glass slide (GLAS) using a pipette. Shims with a thickness of 0.38 mm were placed on two edges of the slide to create a gap and set the thickness of the film. A second glass slide (GLAS) was placed on top of the shims, sandwiching the drop and resulting in a relatively constant thickness. The drop was then cured between the two glass slides using UVLED for 10 seconds. The coating was observed under a light microscope, with an image shown in FIG. 24A. In this image it is observed that the particles are randomly dispersed throughout the fluid. A cross sectional SEM is shown in FIG. 24B. The film thickness is in the vertical direction. In this image the particles are orientated such that the w-axis is generally aligned normal to the major surface of the glass slides (GLAS). Particles are largely not aligned in the vertical direction.

Working Example 2

Figure 25A:
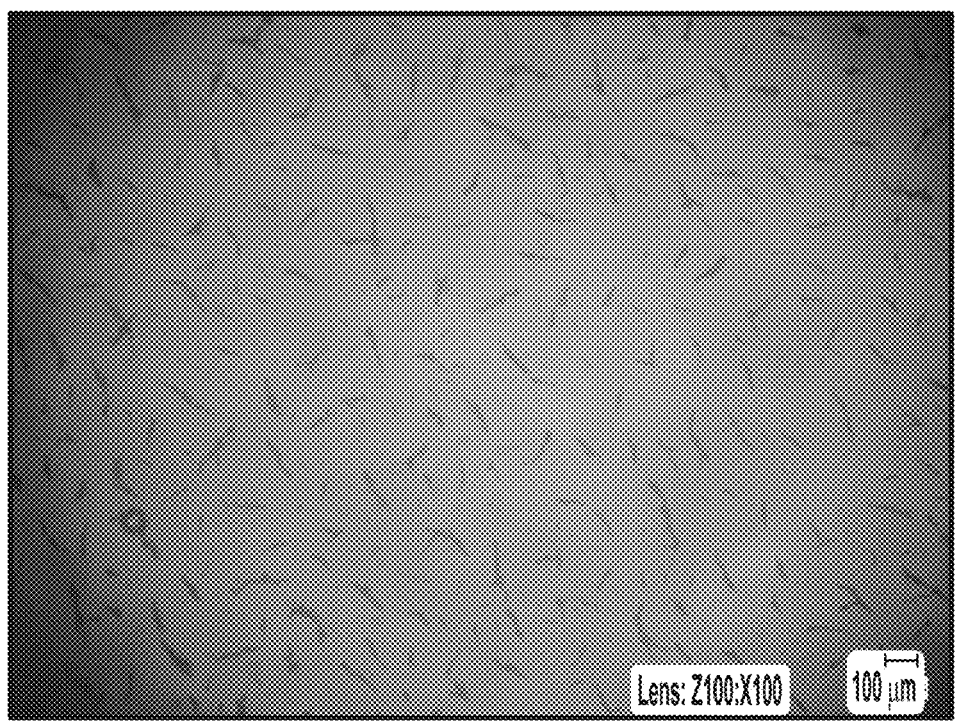
FIG. 25A is an image of a plurality of magnetizable particles aligned in the z-direction due to the application of a magnetic field on a substrate according to an example of the present disclosure but not organized into linear structures as described in the working examples.
Figure 25B:
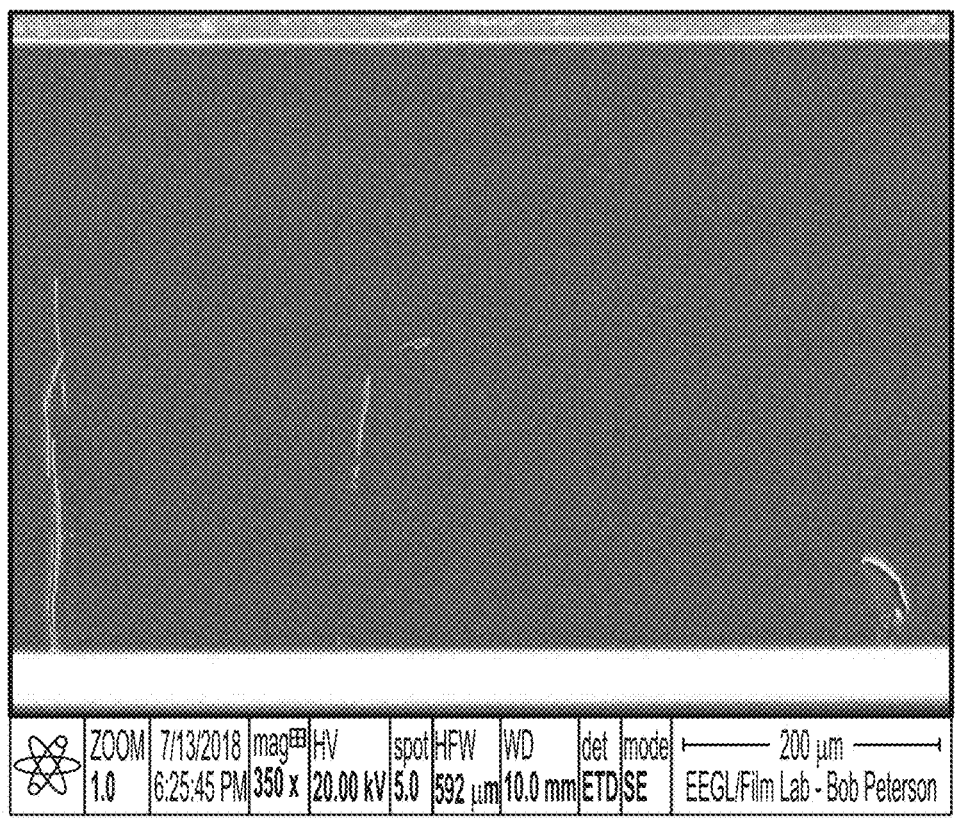
FIG. 25B is a cross-sectional SEM image of a plurality of magnetizable particles aligned in the z-direction due to the application of a magnetic field on a substrate as described in the working examples.

A 0.5 mL droplet of MIX1 was placed on a glass slide (GLAS) using a pipette. Shims with a thickness of 0.38 mm were placed on two edges of the slide to create a gap and set the thickness of the film. A second glass slide (GLAS) was placed on top of the shims, sandwiching the drop and resulting in a relatively constant thickness. This stack of glass, shims, and fluid, was then placed approximately 10 mm above MAGI (which in this experiment was stationary), and then cured between the two glass slides using UVLED for 10 seconds. The coating was observed under a light microscope, with an image shown in FIG. 25A. In this image the particles are oriented such that the w-axis is parallel to the major surface of the GLAS, otherwise randomly oriented, such that the clusters of particles appear randomly oriented in the image. A cross sectional SEM is shown in FIG. 25B. The film thickness is in the vertical direction. Particles are shown as stacked in the direction of the magnetic field.

Working Example 3

Figure 26A:
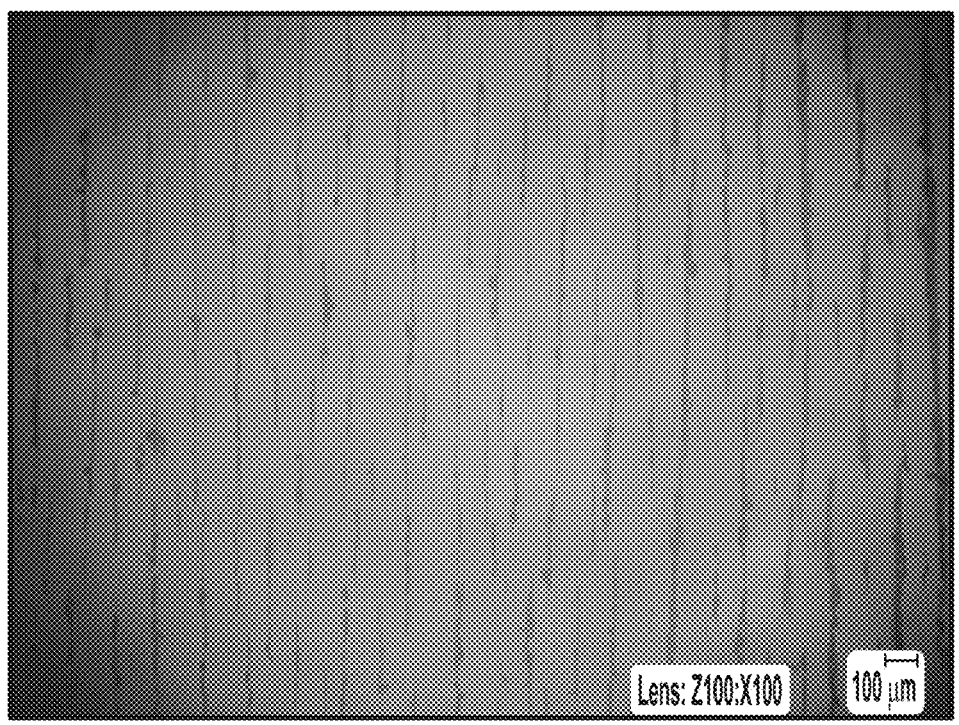
FIG. 26A is an image of a plurality of magnetizable particles arranged with a desired structure due to the application of a magnetic field on a substrate as described in the working examples.
Figure 26B:
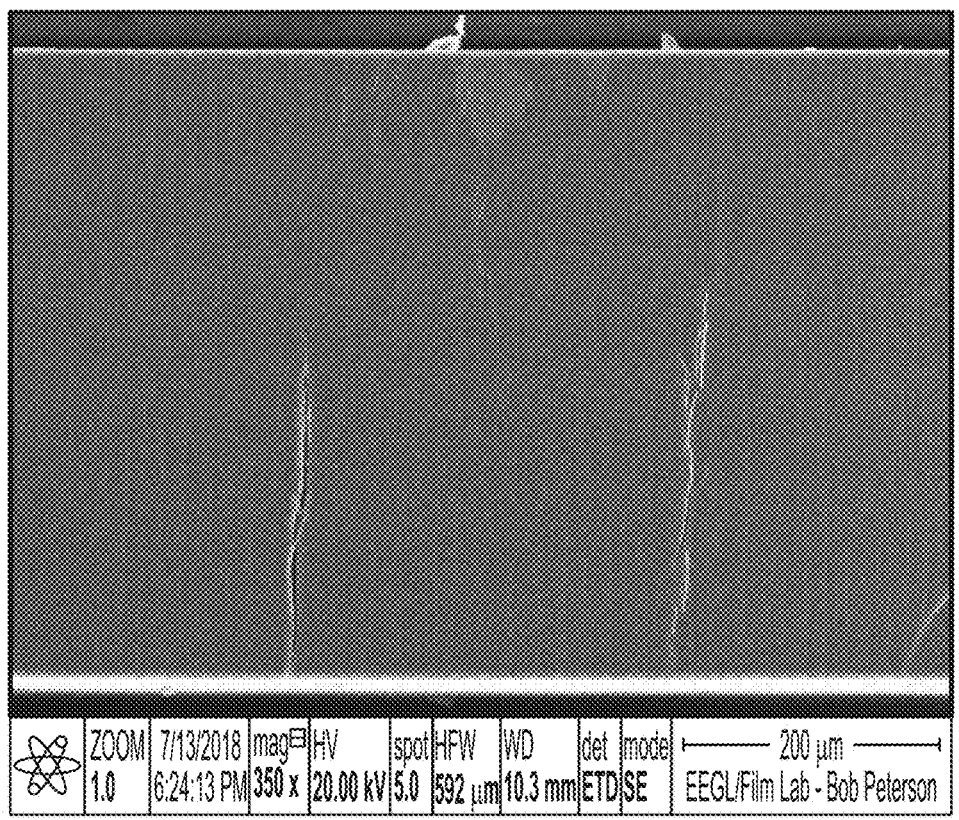
FIG. 26B is s cross-sectional SEM image of a plurality of magnetizable particles aligned in the z-direction due to the application of a magnetic field on a substrate as described in the working examples.

A 0.5 mL droplet of MIX1 was placed on a glass slide (GLAS) using a pipette. Shims with a thickness of 0.38 mm were placed on two edges of the slide to create a gap and set the thickness of the film. A second glass slide (GLAS) was placed on top of the shims, sandwiching the drop and resulting in a relatively constant thickness. This stack of glass, shims, and fluid, was then placed approximately 10 mm above MAGI while MAGI was being rotated at 2,500 RPM, and then cured between the two glass slides using UVLED for 10 seconds. The coating was observed under a light microscope, with an image shown in FIG. 26A. In this image the particles are oriented such that the w-axis is parallel to the axis of rotation (Y-axis), and positioned such that the clusters of particles create linear, oriented structures. A cross sectional SEM is shown in FIG. 26B. The film thickness is in the vertical direction. Particles are shown as stacked in the direction of the magnetic field.

Working Example 4

Figure 27A:
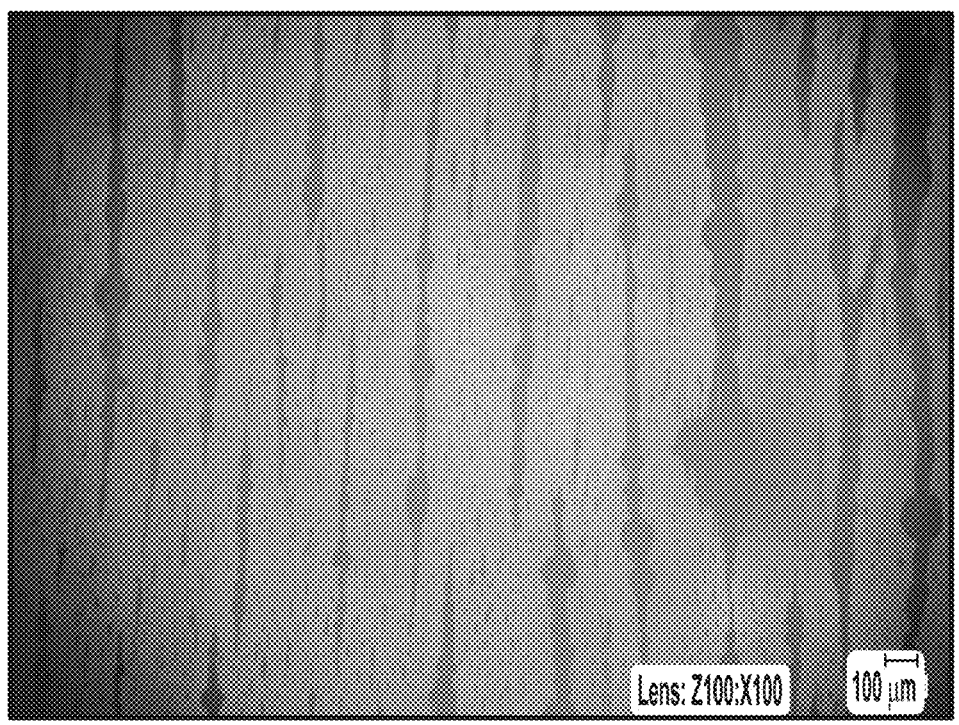
FIG. 27A is an image of a plurality of magnetizable spherical particles arranged with a desired structure due to the application of a magnetic field on a substrate as described in the working examples.
Figure 27B:
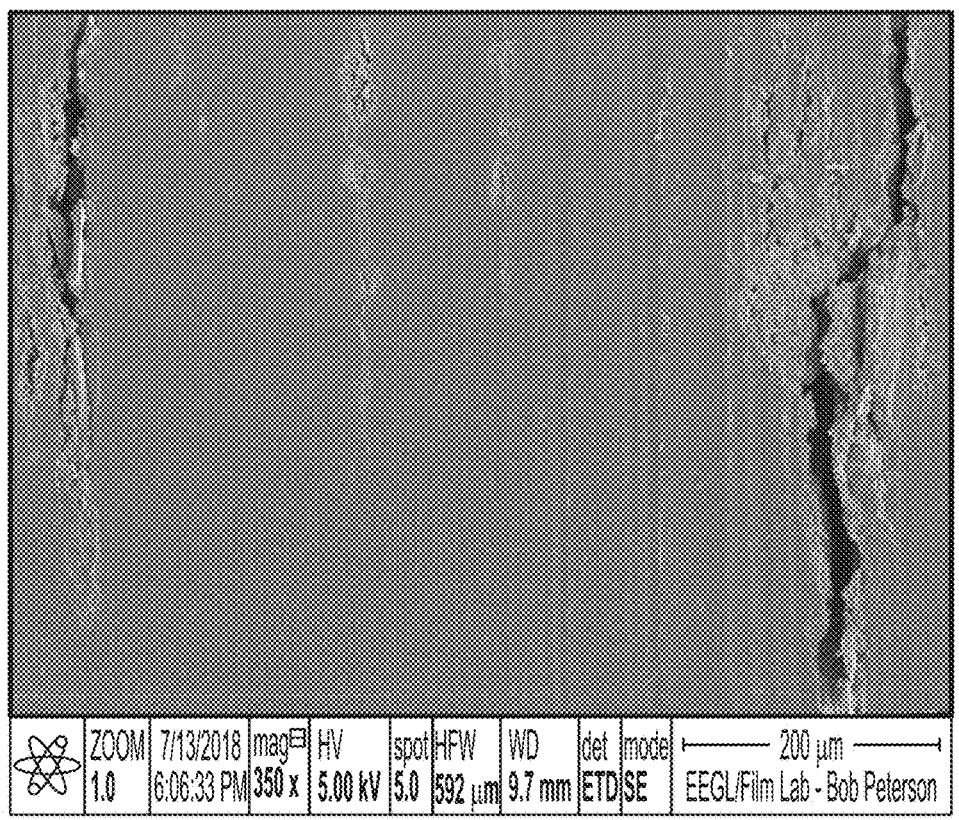
FIG. 27B is a cross-sectional SEM image of a plurality of magnetizable spherical particles stacked in the z-direction due to the application of a magnetic field on a substrate as described in the working examples.
Figure 27C:
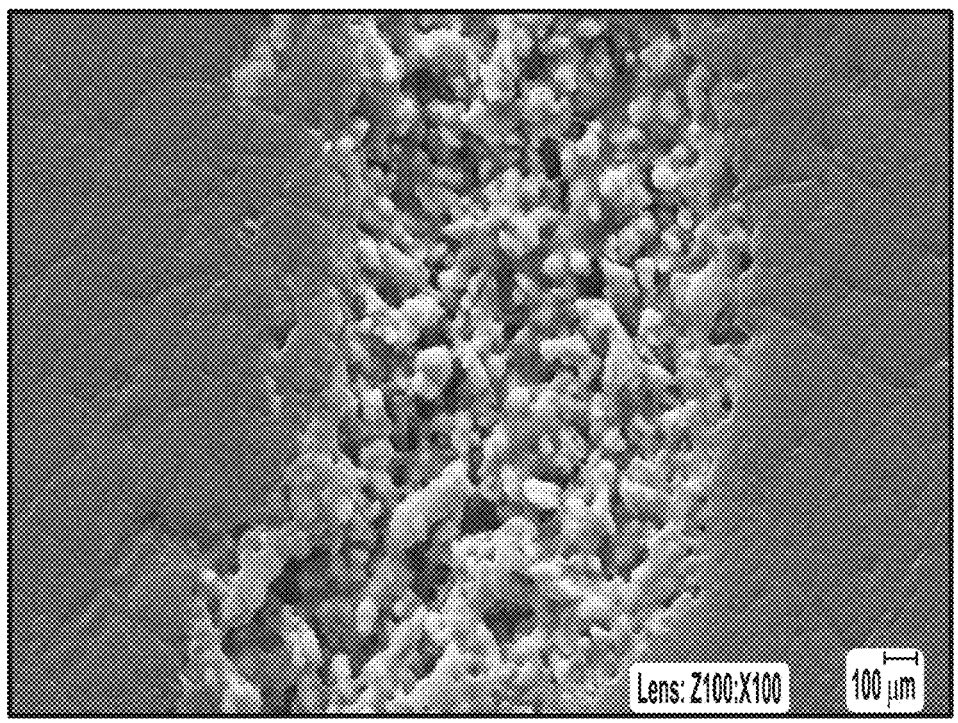
FIG. 27C is a higher magnification SEM of FIG. 27B showing the linear structures are an assembly of spherical particles.

A 0.5 mL droplet of MIX2 was placed on a glass slide (GLAS) using a pipette. Shims with a thickness of 0.38 mm were placed on two edges of the slide to create a gap and set the thickness of the film. A second glass slide (GLAS) was placed on top of the shims, sandwiching the drop and resulting in a relatively constant thickness. This stack of glass, shims, and fluid, was then placed approximately 10 mm above MAGI while MAGI was being rotated at 2,500 RPM, and then cured between the two glass slides using UVLED for 10 seconds. The coating was observed under a light microscope, with an image shown in FIG. 27A. In this image the particles appear to be clustered together, as well as aligned such that they create linear, oriented structures. A cross sectional SEM is shown in FIG. 27B. The film thickness is in the vertical direction. FIG. 27C is a higher magnification SEM of FIG. 27B showing the linear structures are an assembly of spherical particles.

Working Example 5

Figure 28A:
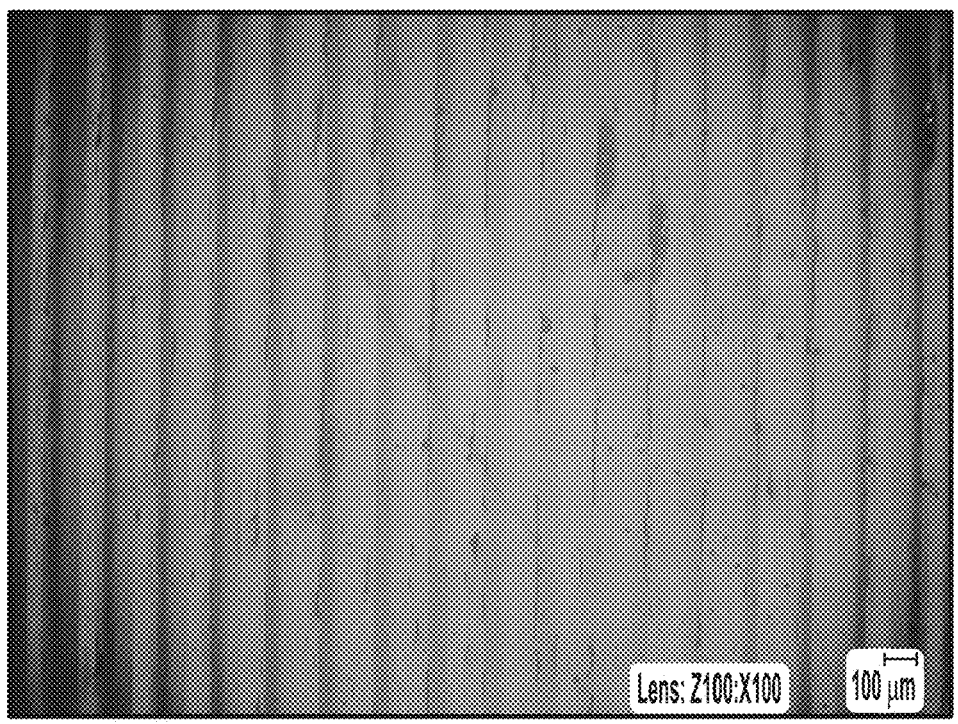
FIG. 28A is an image of a plurality of magnetizable particles arranged with a desired structure due to the application of a magnetic field on a microstructured substrate as described in the working examples.
Figure 28B:
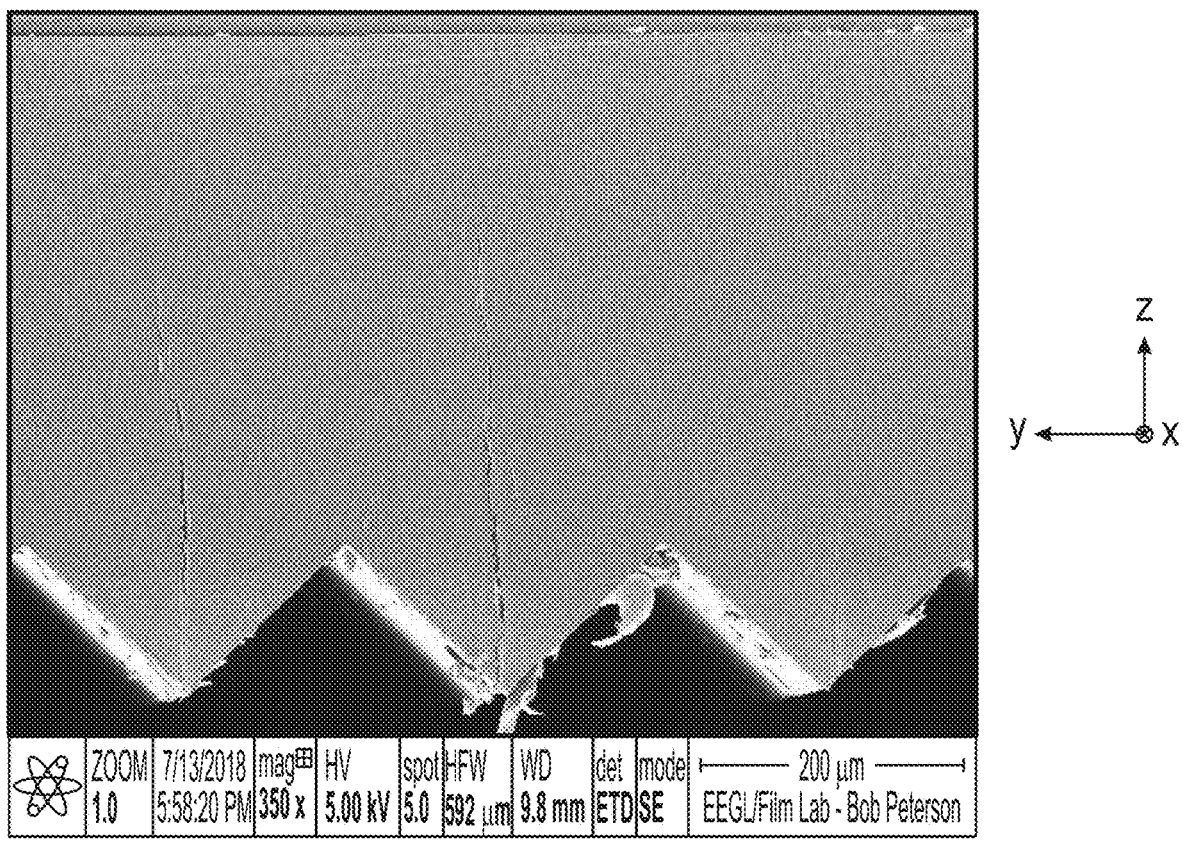
FIG. 28B is a cross-sectional SEM image of a plurality of magnetizable particles aligned in the z-direction and coincident with valleys of the prismatic surface due to the application of a magnetic field on a microstructured substrate as described in the working examples.
Figure 29A:
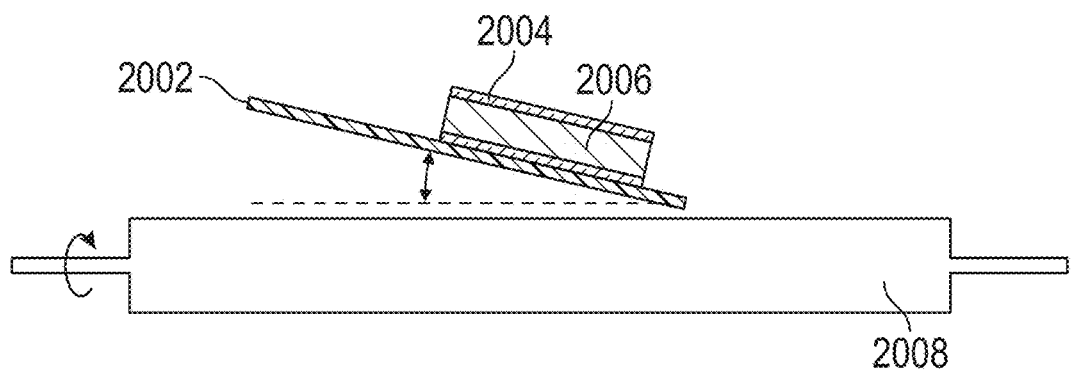
FIG. 29A is a schematic FIG. of an arrangement of an optical film angled relative to a rotating magnet as is further described in the working examples.
Figure 29B:
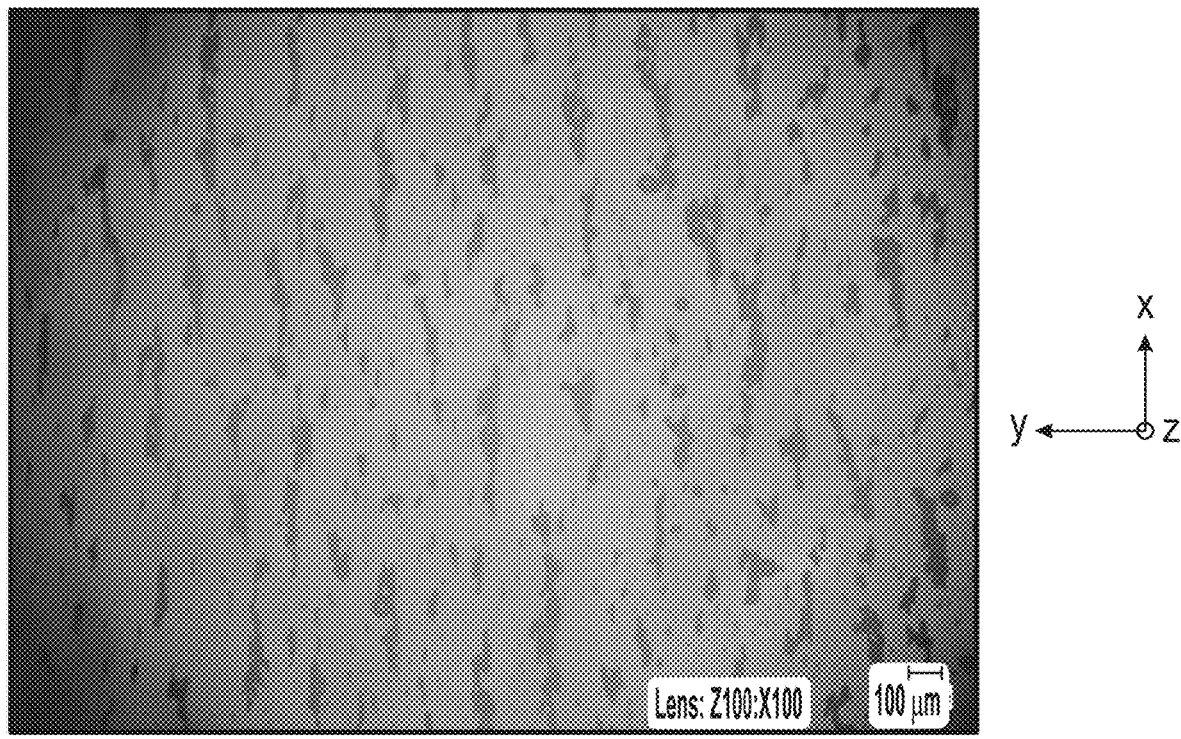
FIG. 29B is an image of a plurality of tilted magnetizable particles arranged with a desired structure due to the application of a magnetic field on a substrate according to an example of the present disclosure.
Figure 29C:
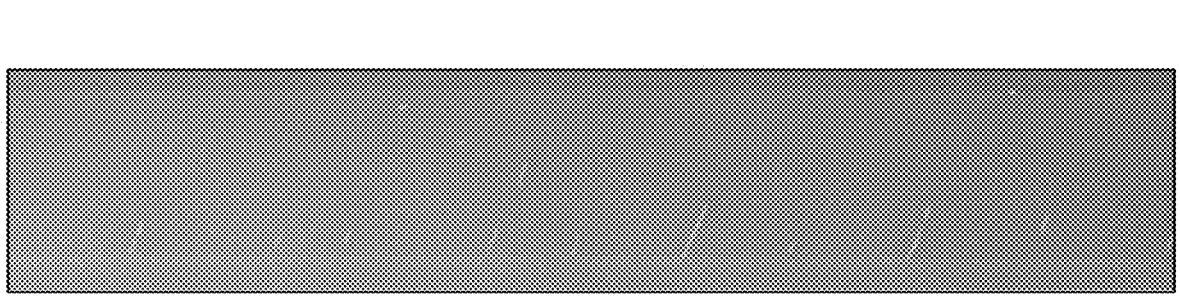
FIG. 29C is a cross-section of the coating of FIG. 29B.

A 0.5 mL droplet of MIX1 was placed on the surface of a prismatic film (Optical Lighting Film OLF-2405 as obtained by 3M Company, St. Paul, Minn.) using a pipette. Shims with a thickness of 0.38 mm were placed on a glass slide, and this slide was placed on top of the film such that the drop of MIX1 was sandwiched between the film and the slide, and the shims set the thickness of the coating above the prism structure. This stack of film, glass, shims, and fluid, was then placed approximately 10 mm above the MAGI, while MAGI was being rotated at 2,500 RPM. The drop was then cured between the film and the slide using UVLED for 10 seconds. The coating was observed under a light microscope, with an image shown in FIG. 28A. In this image the particles are oriented such that the w-axis is parallel to the axis of rotation (Y-axis), and positioned such that the clusters of particles create linear, oriented structures. Additionally, the structures are contained within the grooves of the film—i.e. the particles create louvers that are embedded within the prismatic film. A cross sectional SEM is shown in FIG. 28B. The film thickness is in the vertical direction. Particles are shown as stacked in the direction of the magnetic field and are coincident with the valleys of the prisms.

Working Example 6

A 0.5 mL droplet of MIX1 was placed on a glass slide (GLAS) (2002) using a pipette. Shims (2006) with a thickness of 0.38 mm were placed on two edges of the slide to create a gap and set the thickness of the film. A second glass slide (GLAS) (2004) was placed on top of the shims (2006), sandwiching the drop and resulting in a relatively constant thickness. This stack of glass, shims, and fluid, was then held over MAGI (2008) at a 20° angle relative to the length of the magnet (see FIG. 29A). MAGI (2008) was rotated at 2,500 RPM, and the drop was then cured between the two glass slides using UVLED for 10 seconds. The coating was observed under a light microscope, with an image shown in FIG. 29B and a cross-section of the coating in FIG. 29C. In this image the particles are oriented such that the w-axis is parallel to the axis of rotation (Y-axis), and positioned such that the clusters of particles create linear, oriented structures. However, in this example the coating itself is tilted relative to the magnet, creating linear structures that are inclined relative to the normal vector of the glass slide (see FIG. 29A).

Working Example 7

The method performed here was identical to that in WORKING EXAMPLE 3, with the exception that the distance between MAGI and the bottom of the stack of glass slides was varied, according to Table 3. Multiple microscope images were taken, and approximate spacings between adjacent linear, oriented structures was measured, with an average also tabulated in Table 3. From this it is noted that the spacing between adjacent structures was found to increase in general as the distance from the magnet was increased. It should be noted that with a spacing of 150 mm, the structures no longer had enough orientation to reliably measure a spacing, and a value was not recorded at this point.

TABLE 3

| Distance from magnet (mm) | Spacing (μm) |
|---|---|
| 10 | 156 |
| 50 | 182 |
| 100 | 237 |
| 150 | N/A |

The invention claimed is:

1. A method of making an optical film for control of light comprising:
   positioning a first mixture on a substrate, wherein the first mixture comprises a first plurality of magnetizable particles dispersed in a first resin;
   assembling the first plurality of magnetizable particles into a desired structure for the control of the light by rotating modulation of at least a first magnetic field relative to the first plurality of magnetizable particles;
   vitrifying the first resin using a first vitrification technique while the first plurality of magnetizable particles are in the desired structure;
   forming a second mixture that comprises a second plurality of magnetizable particles dispersed in a second resin;
   positioning the second mixture on one or more of the substrate, a second substrate or the first mixture;
   assembling the second plurality of magnetizable particles into a second desired structure for the control of the light further by rotating modulation of at least a second magnetic field relative to the second plurality of magnetizable particles; and
   vitrifying the second resin using a different, second vitrification technique while the second plurality of magnetizable particles are in the second desired structure.

2. The method of claim 1, wherein the vitrifying the first resin comprises at least partially polymerizing the first resin.

3. The method of claim 1, wherein the second mixture and the first mixture have one of a different composition or substantially a same composition, and if the substantially the same composition, the second mixture is positioned after increasing the viscosity of the first resin while the first plurality of magnetizable particles are in the desired structure.

4. The method of claim 1, wherein the first plurality of magnetizable particles have at least one of a shared first orientation or first common alignment direction relative to the substrate and the second plurality of magnetizable particles have at least one of a shared second orientation or second common alignment direction relative to the substrate, and wherein the shared first orientation or first common alignment direction differs from the shared second orientation or second common alignment direction.

5. The method of claim 1, wherein rotating modulation of at least the first magnetic field relative to the first plurality of magnetizable particles and rotating modulation of at least the second magnetic field relative to the second plurality of magnetizable particles is from a single magnet.

6. The method of claim 1, further comprising varying the first magnetic field relative to the first plurality of magnetizable particles by one or more of: moving the first plurality of magnetizable particles relative to the first magnetic field in one or more directions, moving the first magnetic field relative to the first plurality of magnetizable particles in at least a second direction, varying a strength of the first magnetic field, and providing for at least one of localized irregularities or flux concentrations in the first magnetic field.

7. The method of claim 6, wherein moving the first plurality of magnetizable particles relative to the first magnetic field includes one or more of applying a texture to one or more of the first mixture and the substrate to provide the one or more of the first mixture and the substrate with a variable thickness, curving the substrate and first mixture in one or more of a down-web and cross-web direction, distorting the substrate and first mixture, and depositing the first mixture on the substrate with the substrate having a variable thickness.

8. The method of claim 6, wherein moving the first magnetic field relative to the first plurality of magnetizable particles in at least the second direction includes one or more of translating the first magnetic field one or more of cross-web and down-web in a plane orthogonal to an axis of rotation of the first magnetic field and dithering the first magnetic field one or more of cross-web and down-web in a plane orthogonal to the axis of rotation of the first magnetic field.

9. A method of making an optical film for control of light comprising:
   providing a substrate, a first mixture including a first plurality of magnetizable particles dispersed in a first resin and a second mixture including a second plurality of magnetizable particles dispersed in a second resin;
   assembling the first plurality of magnetizable particles into a first desired structure for the control of the light by rotating modulation of at least a first magnetic field relative to the first plurality of magnetizable particles;
   vitrifying the first resin with the first plurality of magnetizable particles assembled in the first desired structure;
   assembling the second plurality of magnetizable particles into a second desired structure for the control of the light by rotating modulation of at least a second magnetic field relative to the second plurality of magnetizable particles; and
   vitrifying the second resin with the second plurality of magnetizable particles assembled in the second desired structure;
   wherein the first resin and the second resin have a different composition and are vitrified using a different vitrification technique.

10. The method of claim 9, wherein the different vitrification technique comprises UV vitrification with the vitrifying the first resin at a first wavelength and the vitrifying the second resin at a second wavelength.

11. The method of claim 10, wherein moving the first magnetic field relative to the first plurality of magnetizable particles in at least the second direction includes one or more of translating the first magnetic field one or more of cross-web and down-web in a plane orthogonal to an axis of rotation of the first magnetic field and dithering the first magnetic field one or more of cross-web and down-web in a plane orthogonal to the axis of rotation of the first magnetic field.

12. The method of claim 9, further comprising varying at least the first magnetic field relative to the first plurality of magnetizable particles by one or more of: moving the first plurality of magnetizable particles relative to the first magnetic field in one or more directions, moving the first magnetic field relative to the first plurality of magnetizable particles in at least a second direction, varying a strength of the first magnetic field, and providing for at least one of localized irregularities and flux concentrations in the first magnetic field.

13. The method of claim 12, wherein moving the first plurality of magnetizable particles relative to the first magnetic field includes one or more of applying a texture to one or more of the first mixture and the substrate to provide the one or more of the first mixture and the substrate with a variable thickness, curving the substrate and first mixture in one or more of a down-web and cross-web direction, distorting the substrate and first mixture, and depositing the first mixture on the substrate with the substrate having a variable thickness.

14. A light control film made by the method of claim 9.

15. A light control film, comprising:
a substrate;
a first layer coupled directly or indirectly to the substrate, comprising a first mixture of a first optically clear resin and a first plurality of magnetizable particles, wherein the first plurality of magnetizable particles comprises a first desired structure; and
a second layer coupled directly or indirectly to the first layer, comprising a second mixture of a second optically clear resin and a second plurality of magnetizable particles, wherein the second plurality of magnetizable particles comprise a second desired structure;
wherein the first plurality of magnetizable particles have a shared first orientation with respect to the substrate and the second plurality of magnetizable particles have a shared second orientation with respect to the substrate, wherein the shared first orientation and shared second orientation are substantially different from each other;
and wherein the first layer and second layer are disposed such that a same light is at least partially transmitted through the first layer and the second layer.

16. The light control film of claim 15, wherein the first desired structure and the second desired structure are substantially similar.

17. The light control film of claim 15, wherein the first desired structure and the second desired structure are substantially different.

* * * * *